(12) United States Patent
Xu et al.

(10) Patent No.: US 12,272,305 B2
(45) Date of Patent: Apr. 8, 2025

(54) DISPLAY SUBSTRATE AND DISPLAY DEVICE

(71) Applicant: BOE TECHNOLOGY GROUP CO., LTD., Beijing (CN)

(72) Inventors: Zhiqiang Xu, Beijing (CN); Wei Qin, Beijing (CN); Chunfang Zhang, Beijing (CN); Weixing Liu, Beijing (CN); Tieshi Wang, Beijing (CN); Xuefei Sun, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 100 days.

(21) Appl. No.: 17/784,689

(22) PCT Filed: Aug. 19, 2021

(86) PCT No.: PCT/CN2021/113491
§ 371 (c)(1),
(2) Date: Jun. 13, 2022

(87) PCT Pub. No.: WO2022/062785
PCT Pub. Date: Mar. 31, 2022

(65) Prior Publication Data
US 2023/0010444 A1 Jan. 12, 2023

(30) Foreign Application Priority Data
Sep. 28, 2020 (CN) .......................... 202011045275.9

(51) Int. Cl.
*G09G 3/3233* (2016.01)
(52) U.S. Cl.
CPC ........... *G09G 3/3233* (2013.01); *G09G 2300/0452* (2013.01); *G09G 2320/0233* (2013.01)

(58) Field of Classification Search
CPC ......... G09G 3/3233; G09G 2300/0452; G09G 2320/0233; G09G 2300/0426; H10K 59/353; H10K 59/12
See application file for complete search history.

(56) References Cited

U.S. PATENT DOCUMENTS

| 11,335,284 B2 | 5/2022 | Wang et al. | |
| 2018/0129328 A1* | 5/2018 | Park | G01S 7/4814 |

(Continued)

FOREIGN PATENT DOCUMENTS

| CN | 110047897 A | 7/2019 |
| CN | 110867480 A | 3/2020 |

(Continued)

*Primary Examiner* — Amit Chatly
*Assistant Examiner* — Chayce R Bibbee
(74) *Attorney, Agent, or Firm* — HOUTTEMAN LAW LLC

(57) ABSTRACT

A display substrate and a display device are disclosed. The display substrate includes a light-transmitting region, wherein the light-transmitting region includes a plurality of rows of effective sub-pixel sets and a plurality of main spacers, each row of the plurality of rows of effective sub-pixel sets includes a plurality of effective sub-pixel sets, each of the plurality of effective sub-pixel sets includes a plurality of effective sub-pixels, any two adjacent effective sub-pixel sets in a same row are spaced apart from each other by one main spacer, the main spacer includes at least two sub-spacers arranged along a column direction. At least two sub-spacers arranged along a row direction have different widths; and/or at least two sub-spacers of a same main sub-spacer have different widths.

20 Claims, 18 Drawing Sheets

(56) References Cited

U.S. PATENT DOCUMENTS

| | | | | |
|---|---|---|---|---|
| 2019/0033628 A1* | 1/2019 | Kawata | ............... | G02F 1/13394 |
| 2019/0165080 A1* | 5/2019 | Ito | ........................ | H10K 59/124 |
| 2020/0124927 A1* | 4/2020 | Kim | .................... | H10K 50/822 |
| 2020/0265798 A1* | 8/2020 | Choi | .................... | H10K 59/351 |

FOREIGN PATENT DOCUMENTS

| | | |
|---|---|---|
| CN | 111584548 A | 8/2020 |
| CN | 111708230 A | 9/2020 |
| CN | 112038390 A | 12/2020 |

* cited by examiner

DISPLAY SUBSTRATE AND DISPLAY DEVICE

TECHNICAL FIELD

The present disclosure relates to the field of display technology, in particular to a display substrate and a display device.

BACKGROUND

Organic Light-Emitting Diode (OLED) displays are a mainstream display screen at present and widely applied to mobile phones, computers, televisions and other application scenes of the display screens due to their advantages such as good picture quality, low power consumption, lightness, thinness, flexibility and the like.

With the increasing occupation ratio of the screen of the mobile phone, hiding front cameras below the screen gradually becomes the key development direction of the display screen of the mobile phone at present.

SUMMARY

Embodiments of the present disclosure provide a display substrate and a display device.

As a first aspect, the present disclosure provides a display substrate including a light-transmitting region, wherein the display substrate includes a plurality of rows of effective sub-pixel sets and a plurality of main spacers in the light-transmitting region, each row of the plurality of rows of effective sub-pixel sets includes a plurality of effective sub-pixel sets, each of the plurality of effective sub-pixel sets includes a plurality of effective sub-pixels, any two adjacent effective sub-pixel sets in a same row are spaced apart from each other by one main spacer, the main spacer includes at least two sub-spacers arranged along a column direction.

At least two sub-spacers arranged along a row direction have different widths; and/or at least two sub-spacers of a same main sub-spacer have different widths.

In some embodiments, the at least two sub-spacers include a first sub-spacer and a second sub-spacer, and a width of the first sub-spacer is 2 to 6 times a width of the second sub-spacer.

In some embodiments, multiple effective sub-pixels are disposed between at least two adjacent main spacers arranged in the column direction.

In some embodiments, the at least two main spacers arranged in the column direction are adjacent and connected to each other.

In some embodiments, an orthographic projection of at least one main spacer in one column of two adjacent columns of main spacers along the column direction overlaps an orthographic projection of at least one main spacer in the other column of the two adjacent columns of main spacers along the column direction.

In some embodiments, orthographic projections of at least two columns of main spacers along the column direction have different widths.

In some embodiments, at least one of the main spacers is an axisymmetric pattern or a centrosymmetric pattern.

In some embodiments, any two adjacent sub-spacers arranged in the row direction have different widths; and/or any two adjacent sub-spacers of a same main sub-spacer have different widths.

In some embodiments, the plurality of effective sub-pixels in each of the plurality effective sub-pixel sets are arranged in two rows, and the first sub-spacer and the second sub-spacer are respectively disposed in the same row as two adjacent rows of effective sub-pixel sets.

In some embodiments, the plurality of effective sub-pixels in each of the plurality effective sub-pixel sets are arranged in two rows and two columns. The plurality of effective sub-pixels in each of the plurality effective sub-pixel sets include a red sub-pixel, a blue sub-pixel and two green sub-pixels, wherein the two green sub-pixels are disposed in a same column.

In some embodiments, the plurality of effective sub-pixels in each of the plurality effective sub-pixel sets are arranged in two rows. The first sub-spacer and the second sub-spacer are respectively disposed in the same row as two adjacent rows of effective sub-pixels.

In some embodiments, the plurality of effective sub-pixels in each of the plurality effective sub-pixel sets include one first color sub-pixel, two second color sub-pixels and one third color sub-pixel. The two second color sub-pixels are positioned in a same column, and the first color sub-pixel and the third color sub-pixel are respectively disposed on two sides of the column in which the two second color sub-pixels are positioned. The first color sub-pixel, the third color sub-pixel and one of the two second color sub-pixels are arranged along the row direction; or the first color sub-pixel and one of the two second color sub-pixels are arranged along the row direction, and the third color sub-pixel and the other of the two second color sub-pixels are arranged along the row direction.

In some embodiments, the plurality of effective sub-pixels in each of the plurality of the effective sub-pixel sets include first color sub-pixels, second color sub-pixels and third color sub-pixels. In each of the plurality of the effective sub-pixel sets, the number of the second color sub-pixels is an even number more than or equal to 4, every two second color sub-pixels are arranged in a column, the first color sub-pixel and the third color sub-pixel are arranged between two adjacent columns of the second color sub-pixels. In at least two adjacent effective sub-pixel sets arranged along the row direction, a proportion of a total number of the second color sub-pixels, a total number of the first color sub-pixels, and a total number of the third color sub-pixels is 2:1:1.

In some embodiments, a plurality of first secondary-spacer are further disposed in the light transmitting region, and each first secondary-spacer is located between two adjacent effective sub-pixels arranged in the row direction of each of the effective sub-pixel sets.

In some embodiments, a plurality of effective sub-pixels of at least one of the effective sub-pixel sets include second color sub-pixels and first color sub-pixels or third color sub-pixels. The number of the second color sub-pixels is an even number greater than or equal to 4, every two second color sub-pixels are arranged in a column, the first color sub-pixels or the third color sub-pixels are arranged on two sides of each column of the second color sub-pixels, and the first secondary-spacer is positioned between every two adjacent columns of the second color sub-pixels. At least one of the remaining effective sub-pixel sets includes second color sub-pixels, first color sub-pixels, and third color sub-pixels. The first color sub-pixels and the third color sub-pixels form mixed-color sub-pixel columns spaced apart from each other. Each of the mixed-color sub-pixel columns includes one first color sub-pixel and one third color sub-pixel, the second color sub-pixels are arranged on two sides of each of the mixed-color sub-pixel columns, and the first secondary-spacer is located between the every two adjacent mixed-color sub-pixel columns.

In some embodiments, the plurality of effective sub-pixels in each of the effective sub-pixel sets includes a first color sub-pixel, a second color sub-pixel and a third color sub-pixel. In at least two adjacent effective sub-pixel sets arranged along the row direction, the first color sub-pixels have the same position, the second color sub-pixels have the same position, and the third color sub-pixels have the same position. Or alternatively in at least two adjacent effective sub-pixel sets arranged along the row direction, the second color sub-pixels have the same position, and the first color sub-pixel of one of the at least two adjacent effective sub-pixel sets has the same position as the third color sub-pixel of the other of the at least two adjacent effective sub-pixel sets.

In some embodiments, the plurality of effective sub-pixels in each of the effective sub-pixel sets are arranged in three rows. The main spacer further includes a third sub-spacer having a width smaller than a width of the first sub-spacer. The first sub-spacer, the second sub-spacer and the third sub-spacer are respectively arranged in the same row as three rows of the effective sub-pixels continuously arranged.

In some embodiments, the plurality of effective sub-pixels in each of the effective sub-pixel sets include: second color sub-pixels and first color sub-pixels or third color sub-pixels. In four effective sub-pixel sets arranged continuously in the row direction, a proportion of a total number of the second color sub-pixels, a total number of the third color sub-pixels, and a total number of the first color sub-pixels is 2:1:1 or 5:2:2.

In some embodiments, the display substrate further includes: a normal display region around the light transmitting region and a transition region on at least one side of the light transmitting region. The transition region is between the light transmitting region and the normal display region. The transition region includes: a plurality of effective sub-pixels and a plurality of second secondary-spacers, a proportion of an area occupied by the plurality of second secondary-spacers in the transition region is smaller than a proportion of an area occupied by the plurality of main spacers in the light-transmitting region.

In some embodiments, a pixel driving circuit is provided in the effective sub-pixel, and connected to a plurality of signal lines. Each of the plurality of signal lines is a straight line; or alternatively at least one of the plurality of signal lines includes a bent portion bent along an edge of the main spacer.

As a second aspect, an embodiment of the present disclosure further provides a display device including the display substrate in anyone of above embodiments.

BRIEF DESCRIPTION OF DRAWINGS

The accompanying drawings, which are provided for further understanding of the present disclosure and constitute a part of this specification, are for explaining the present disclosure together with the following exemplary embodiments, but are not intended to limit the present disclosure. In the drawings.

DETAIL DESCRIPTION OF EMBODIMENTS

The specific embodiments of the present disclosure will be described in detail below with reference to the accompanying drawings. It should be understood that the specific embodiments described herein are only used to illustrate and explain the present disclosure, but not to limit the present disclosure.

In the OLED display substrate, a plurality of pixel driving circuits and light-emitting devices connected to the pixel driving circuits are disposed on a base substrate. Each of the light-emitting devices includes an anode, a light-emitting material layer and a cathode. Since the anode and the cathode of the light-emitting device are made of the light-transmitting material, the entire OLED display substrate has a degree of light transmittance. With the increasing occupation ratio of the screen of the mobile phone, hiding front cameras below the screen gradually becomes the key development direction of the display screen of the mobile phone at present. Accordingly, in order to further improve the light transmittance of the display screen, in some embodiments, some pixel driving circuits and some light-emitting device in a region of the display substrate corresponding to the cameras are removed.

Figure 1A:
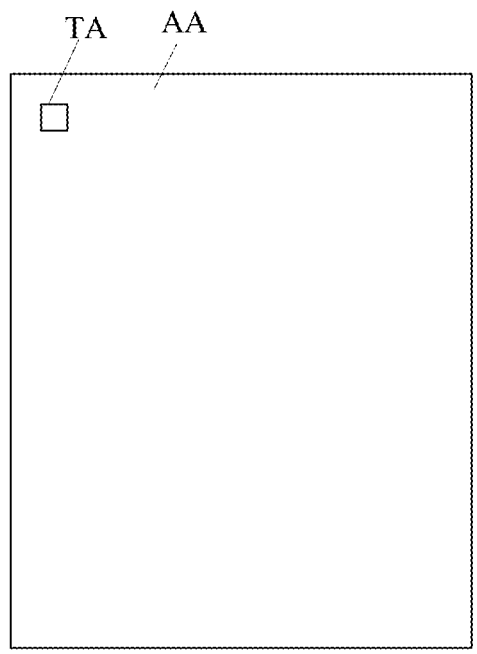
FIG. 1A is a schematic diagram showing an arrangement of regions of a display substrate in the related art.
Figure 1B:
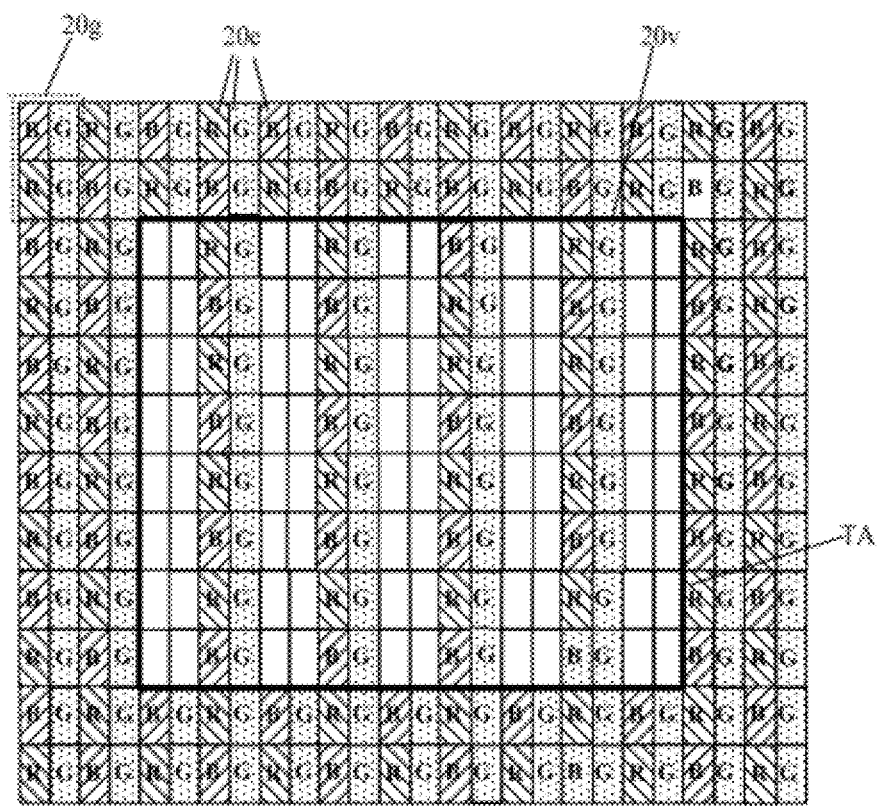
FIG. 1B is a schematic diagram showing a pixel arrangement in the related art.
Figure 1C:
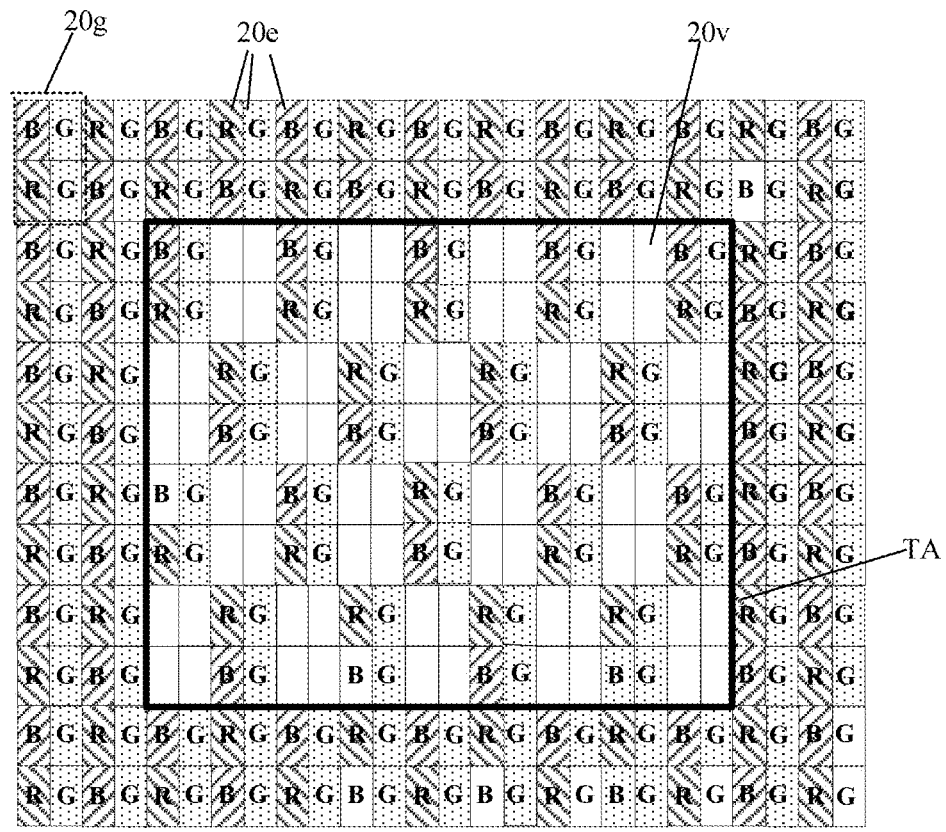
FIG. 1C is a schematic diagram showing another pixel arrangement in the related art.

FIG. 1A is a schematic diagram showing an arrangement of regions in a display substrate in the related art. FIG. 1B is a schematic diagram showing an arrangement for the pixels in the related art. FIG. 1C is a schematic diagram showing another arrangement for the pixels in the related art. As shown in FIGS. 1A to 1C, a light-transmitting region TA directly faces a functional device such as a camera, and a normal display region AA surrounds the light-transmitting region TA. The display substrate includes a plurality of effective sub-pixel sets 20g arranged in an array, each of the effective sub-pixel sets 20g includes a plurality of effective sub-pixels 20e. For example, the plurality of effective sub-pixels 20e of each of the effective sub-pixel sets 20g includes: two green sub-pixels G, one red sub-pixel R, and one blue sub-pixel B.

In order to improve the light transmittance of the light-transmitting region TA, in one embodiment, pixel driving circuits of the effective sub-pixel sets 20g in the odd-numbered columns in the light-transmitting region TA are removed, thereby obtaining the structure shown in FIG. 1B. In other embodiments, in each row of effective sub-pixel sets 20g, pixel driving circuits of a small amount of the effective sub-pixel sets 20g are periodically removed, so that the pixel driving circuits of the effective sub-pixel sets 20g in two adjacent rows among the remaining effective sub-pixel sets 20g are staggered, as shown in FIG. 1C. As an example, a vacant sub-pixel 20v is disposed at a position where the pixel driving circuit is removed, and no light-emitting unit is provided in the vacant sub-pixel 20v; or alternatively, a light-emitting unit may be disposed in the vacant sub-pixel 20v, and a pixel driving circuit connected to the light-emitting unit is disposed in a transition region between the light-transmitting region TA and the normal display region, so as to be connected to the light-emitting unit through wires.

However, in both of the pixel arrangements shown in FIGS. 1B and 1C, light is significantly diffracted when passing through the vacant sub-pixels 20v, resulting in ghost images of images taken by the camera.

Figure 2:
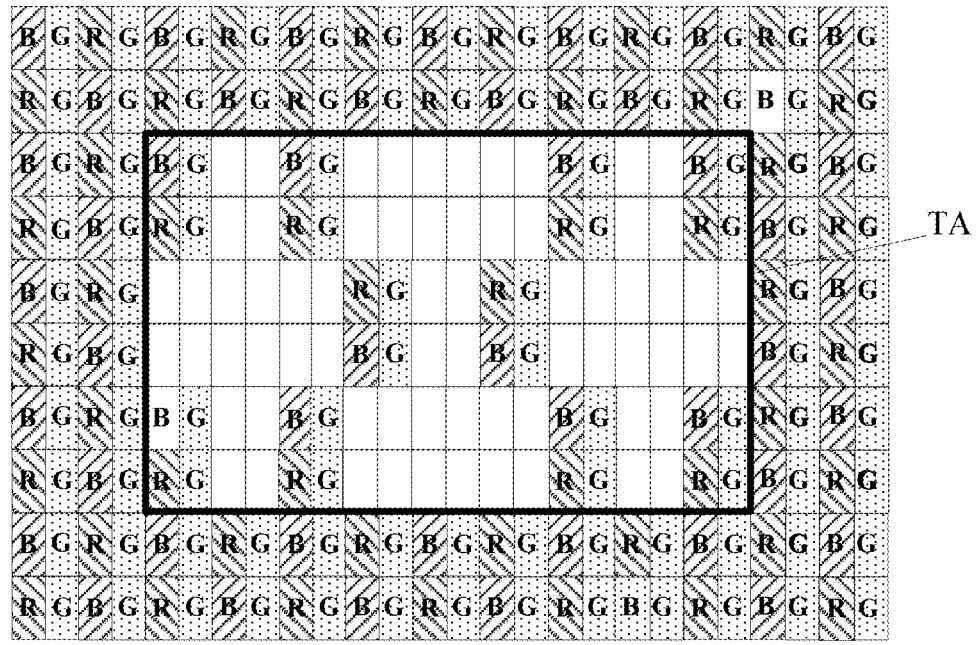
FIG. 2 is a schematic diagram showing a pixel arrangement for a display substrate provided in some embodiments of the present disclosure.

An embodiment of the present disclosure provides a display substrate. FIG. 2 is a schematic diagram showing a pixel arrangement for a display substrate provided in some embodiments of the present disclosure. As shown in FIG. 2, the display substrate includes a light-transmitting region TA and a normal display region (i.e., a region surrounding the light-transmitting region TA in FIG. 2). A positional relationship between the normal display region and the light-transmitting region TA may be the same as that in FIG. 1A. Each of the normal display region and the light-transmitting region TA includes a plurality of sub-pixels arranged in an array. The sub-pixels in the normal display region are all effective sub-pixels 20e, for example, a first color sub-pixel, a second color sub-pixel, and a third color sub-pixel. The plurality of effective sub-pixels 20e in the normal display region form a plurality of effective sub-pixel sets 20g arranged in an array, and each effective sub-pixel set 20g includes 2×2 effective sub-pixels 20e. The first color sub-pixel and the third color sub-pixel are arranged in the same column, and the two second color sub-pixels are arranged in the same column. In the embodiment of the present disclosure, the first color sub-pixel is a red sub-pixel R, the second color sub-pixel is a green sub-pixel G, and the third color sub-pixel is a blue sub-pixel B, as an example.

It should be noted that a pixel driving circuit is disposed in the effective sub-pixel 20e (e.g., the pixel driving circuit has a structure of 7T1C, that is, seven transistors and one capacitor), each pixel driving circuit is connected to the light-emitting unit. The red sub-pixel R (or the green sub-pixel G or the blue sub-pixel B) refer to that the light-emitting unit connected to the pixel driving circuit in the effective sub-pixel 20e emits red light (or green light or blue light).

Figure 3:
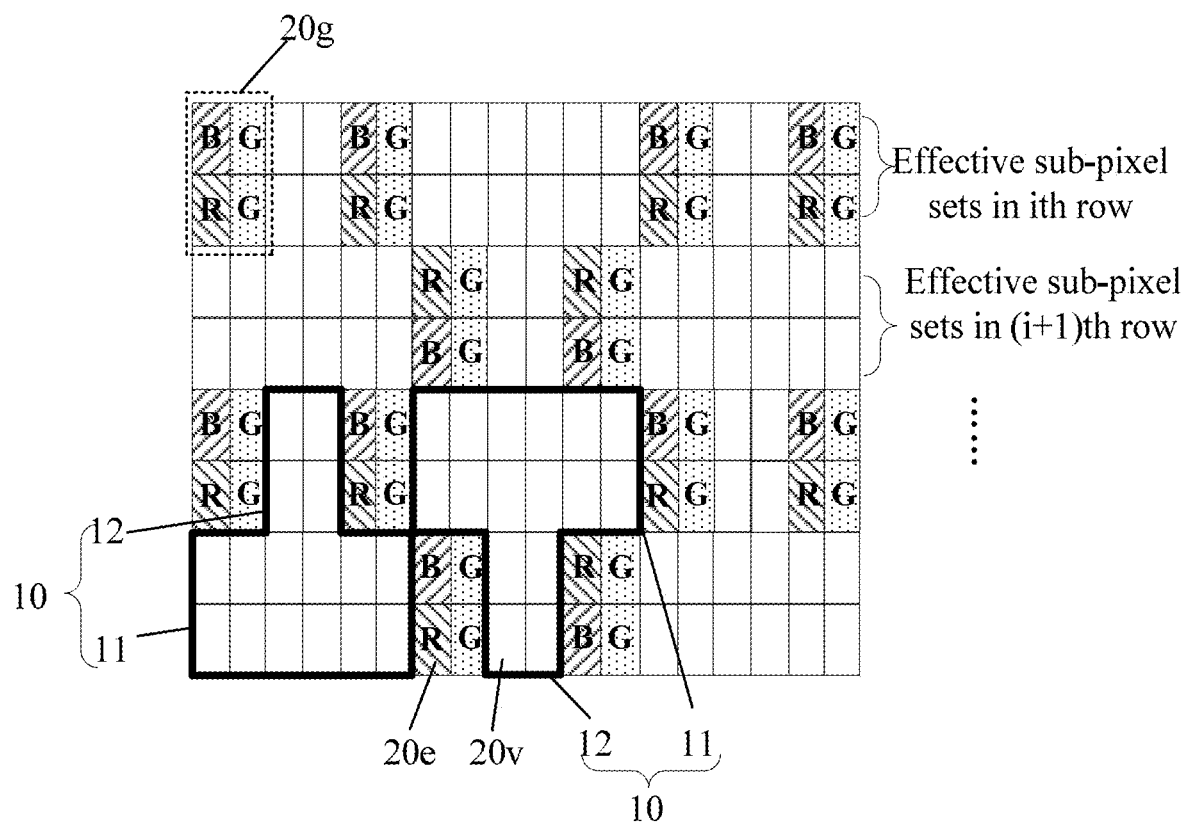
FIG. 3 is a schematic diagram showing a pixel arrangement for a light-transmitting region in FIG. 2.

FIG. 3 is a schematic diagram showing a pixel arrangement for the light-transmitting region in FIG. 2. Some sub-pixels in the light-transmitting region TA are effective sub-pixels 20e, and others in the light-transmitting region TA are vacant sub-pixels 20v. The plurality of effective sub-pixels 20e form a plurality of rows of effective sub-pixel sets 20g, each row of effective sub-pixel sets 20g includes a plurality of effective sub-pixel sets 20g, each of the plurality of effective sub-pixel sets 20g includes a plurality of effective sub-pixels 20e. Any two adjacent effective sub-pixel sets 20g in the same row are spaced apart from each other by a main spacer 10. Any two adjacent effective sub-pixel sets 20g in the same row may be spaced apart from each other by a portion of the main spacer 10 or by the entire main spacer 10. The main spacer 10 includes at least two sub-spacers (i.e., a first sub-spacer 11 and a second sub-spacer 12) arranged in a column direction, and each of the sub-spacers may include at least one vacant sub-pixel 20v. All the sub-spacers of the plurality of main spacers 10 are arranged in rows. Widths of at least two sub-spacers arranged along a row direction are different; and/or widths of at least two sub-spacers of the same main spacer 10 are different. In the embodiment of the present disclosure, the row direction is the left-right direction in FIG. 2, and a column direction is the up-down direction in FIG. 2. In some specific embodiments, any two adjacent sub-spacers arranged in the row direction have different widths; and/or, any two adjacent sub-spacers of the same main spacer 10 have different widths. It should be understood that two adjacent sub-spacers refer to that no sub-spacer is disposed between the two adjacent sub-spacers.

It should be noted that in the embodiment of the present disclosure, the main spacer 10 and the vacant sub-pixel 20v do not indicate that no any structure is provided therein, but some layers (such as a planarization layer, a pixel defining layer, a gate insulating layer, and the like) with high light transmittance may be disposed therein, and even a light-emitting layer, a hole injection layer, a hole transport layer of the light-emitting device and the like may be disposed therein. Even the relevant devices (e.g., thin film transistors, capacitors) in the pixel driving circuit may be provided in the vacant sub-pixels 20v near the normal display region.

Figure 4:
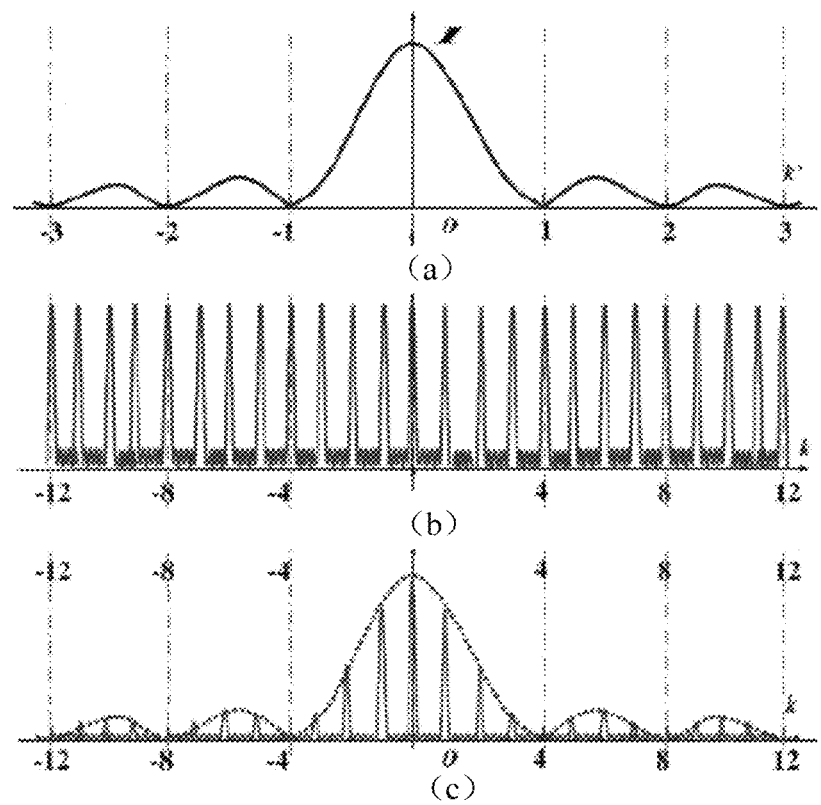
FIG. 4 is a diagram showing light-intensity distributions for single-slit diffraction, multi-beam interference and multi-slit diffraction.

In the embodiment of the present disclosure, each sub-spacer is equivalent to a light-transmitting slit, and the display substrate can be regarded as a grating composed of a plurality of slits. FIG. 4 is a diagram showing light-intensity distributions for single-slit diffraction, multi-beam interference, and multi-slit diffraction. FIG. 4 (*a*) is a diagram showing a light-intensity distribution for single-slit diffraction, FIG. 4 (*b*) is a diagram showing a light-intensity distribution for multi-beam interference, and FIG. 4 (c) is a diagram showing a light-intensity distribution for grating diffraction. As shown in FIG. 4, the multi-slit diffraction is a result of both interference and single-slit diffraction, and the light-intensity distribution formula for the multi-slit diffraction is shown in formula (1):

$$I = I_0 \left(\frac{\sin\alpha}{\alpha}\right)^2 \left(\frac{\sin N\beta}{\sin\beta}\right)^2 \quad (1)$$

Where $$\alpha = \frac{\pi a \sin\theta}{\lambda}, \beta = \frac{\pi d \sin\theta}{\lambda},$$

a is a width of the slit, and d is a period of the slit, i.e., a center-to-center spacing of adjacent slits. I is the light intensity, and $I_0$ is the light-intensity of the zero-order diffraction.

$$\left(\frac{\sin\alpha}{\alpha}\right)^2$$

is a factor for the single-slit diffraction and $$\left(\frac{\sin N\beta}{\sin\beta}\right)^2$$

is a factor for the multi-slit interference. According to the above formula, the light-intensity distribution for single-slit diffraction is only related to the property of single-slit, the light-intensity distribution for multi-slit interference is related to a periodic arrangement of slits, and the light-intensity distribution for multi-slit diffraction is related to the width of each slit and the distribution period of slits.

Figure 5:
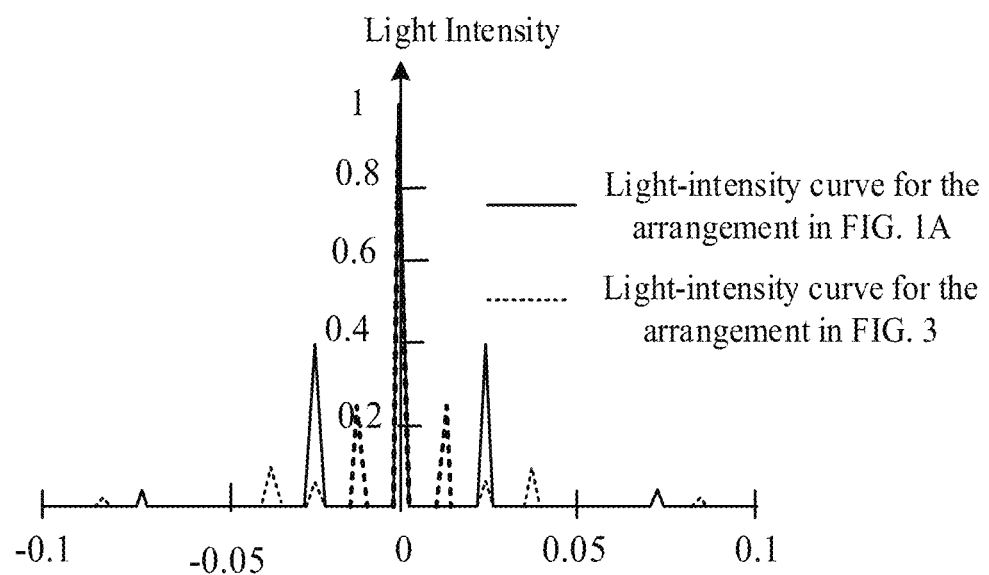
FIG. 5 is a diagram showing a comparison between the intensity of the light diffraction when the pixels are arranged according to an embodiment of the present disclosure and the intensity of the light diffraction when the pixels are arranged as shown in FIG. 1B.

FIG. 5 is a diagram showing a comparison between the intensity of the light diffraction for the pixel arrangement in the embodiment of the present disclosure and the intensity of the light diffraction for the pixel arrangement of FIG. 1B. As shown in FIG. 5, the horizontal axis represents diffraction angle (in radians) and the vertical axis represents the light intensity. In the embodiment of the present disclosure, not all of the widths of the plurality of sub-spacers arranged in the row direction are the same, and/or the widths of two adjacent sub-spacers 11 and 12 of the same main spacer 10 are different. Therefore, compared with the pixel arrangements shown in FIG. 1B and FIG. 1C, when the display substrate provided by the embodiment of the present disclosure is subjected to multi-slit diffraction, more bright stripes or rings appear, and the total energy of light is constant, so that the brightness of the other bright stripes except for the central stripe can be reduced, the diffraction intensity can be decreased, and the imaging effect of the camera can be improved.

Figure 6:
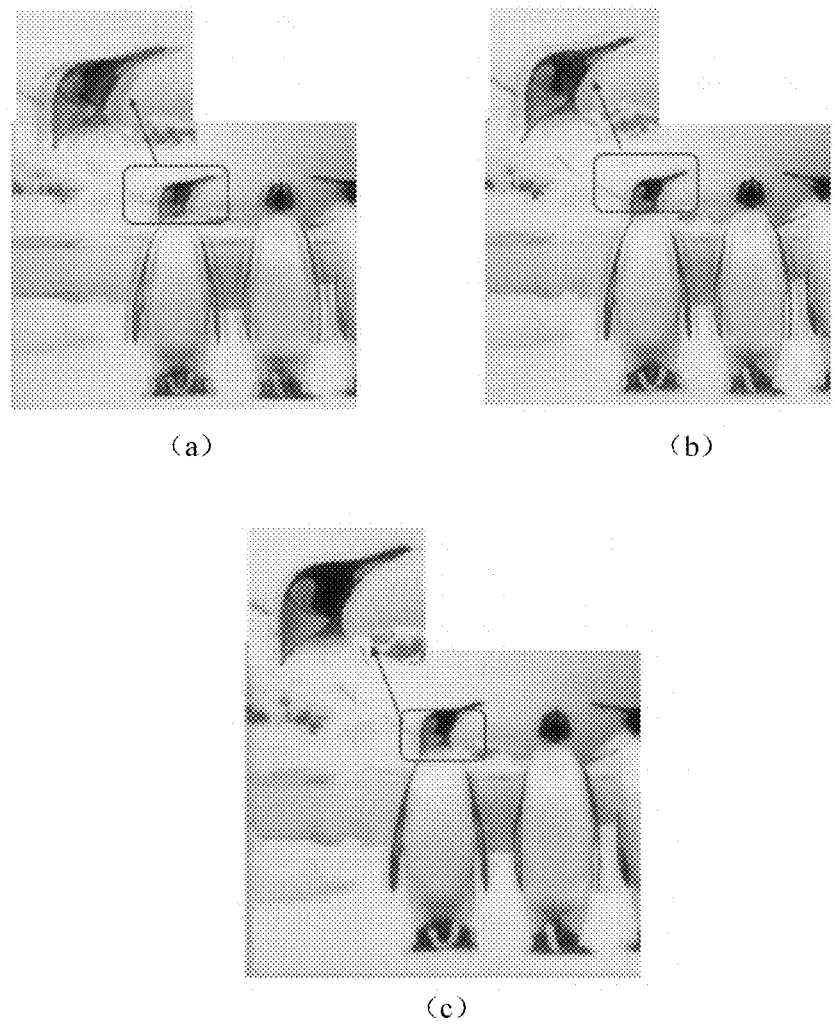
FIG. 6 is a comparison diagram showing imaging effects when the pixels are arranged in different ways.

FIG. 6 is a comparison diagram showing imaging effects for different pixel arrangements. FIG. 6 (a) is a schematic diagram showing the imaging effect of the camera in the case of the pixel arrangement in FIG. 1B; FIG. 6 (b) is a schematic diagram showing the imaging effect of the camera in the case of the pixel arrangement in FIG. 1C; FIG. 6 (c) is a schematic diagram showing the imaging effect of the camera in the case of the pixel arrangement in FIG. 3. It can be seen from the comparison that the imaging effect of the camera is clearest when the pixel arrangement in the embodiment of the present disclosure is adopted.

In some embodiments, as shown in FIG. 3, the plurality of effective sub-pixels 20e in the effective sub-pixel set 20g are arranged in two rows. For example, the effective sub-pixel set 20g includes four effective sub-pixels 20e, that is, a red sub-pixel R, a blue sub-pixel B and two green sub-pixels G. The four effective sub-pixels 20e are arranged in two rows and two columns. The red sub-pixel R and the blue sub-pixel B are arranged in one column, and the two green sub-pixels are arranged in one column. In two adjacent effective sub-pixel sets 20g arranged along the row direction, the positions of the green sub-pixels G are the same and are both on the right side; the red sub-pixels R are located at the same position, and the blue sub-pixels B are located at the same position. Alternatively, the positions of the red sub-pixel R and the blue sub-pixel B in two adjacent effective sub-pixel sets 20g may be interchanged, that is, the position of the red sub-pixel R in one effective sub-pixel set 20g is the same as the position of the blue sub-pixel B in the other effective sub-pixel set 20g. It should be noted that a position of an effective sub-pixel 20e refers to a position where the effective sub-pixel 20e is located in the effective sub-pixel set 20g.

The main spacer 10 includes: the first sub-spacer 11 and the second sub-spacer 12. The first sub-spacer 11 and the second sub-spacer 12 of at least one main spacer 10 are arranged in the same row as two adjacent rows of effective sub-pixel sets 20g, respectively. A width of the first sub-spacer 11 is 2 to 6 times a width of the second sub-spacer 12. For example, as shown in FIG. 3, each effective sub-pixel set 20g includes 2×2 effective sub-pixels 20e, the first sub-spacer 11 of the main spacer 10 includes 2×6 vacant sub-pixels 20v, and the second sub-spacer 12 of the main spacer 10 includes 2×2 vacant sub-pixels 20v. That is, the width of the first sub-spacer 11 is 3 times the width of the effective sub-pixel set 20g. For another example, each effective sub-pixel set 20g includes 2×4 effective sub-pixels 20e, the first sub-spacer 11 of the main spacer 10 includes 2×10 vacant sub-pixels 20v, and the second sub-spacer 12 of the main spacer 10 includes 2×2 vacant sub-pixels 20v. That is, the width of the first sub-spacer 11 is 5 times the width of the effective sub-pixel set 20g.

It should be noted that the "width" of the sub-spacer (or other structures) in the embodiments of the present disclosure refers to a dimension of the sub-spacer (or other structures) in the row direction.

Optionally, two adjacent main spacers 10 arranged along the row direction may be centrosymmetric with a symmetric point, which is a middle point of a line connecting centers of the two main spacers 10.

In some embodiments, effective sub-pixels 20e may be disposed between at least two adjacent main spacers 10 arranged in the column direction. For example, as shown in FIG. 3, two effective sub-pixel sets 20g are provided between two adjacent main spacers 10 arranged in the column direction.

Further, at least two main spacers 10 arranged in the column direction are adjacent and connected to each other. For example, as shown in FIG. 3, the second sub-spacer 12 of one main spacer 10 of two adjacent main spacers 10 arranged in the column direction is adjacent and connected to the first sub-spacer 11 of the other main spacer 10 of the two adjacent main spacers 10.

As shown in FIG. 3, at least one main spacer 10 is an axisymmetric pattern or a centrosymmetric pattern. In an example embodiment, each main spacer 10 is an axisymmetric pattern or a centrosymmetric pattern.

Figure 7:
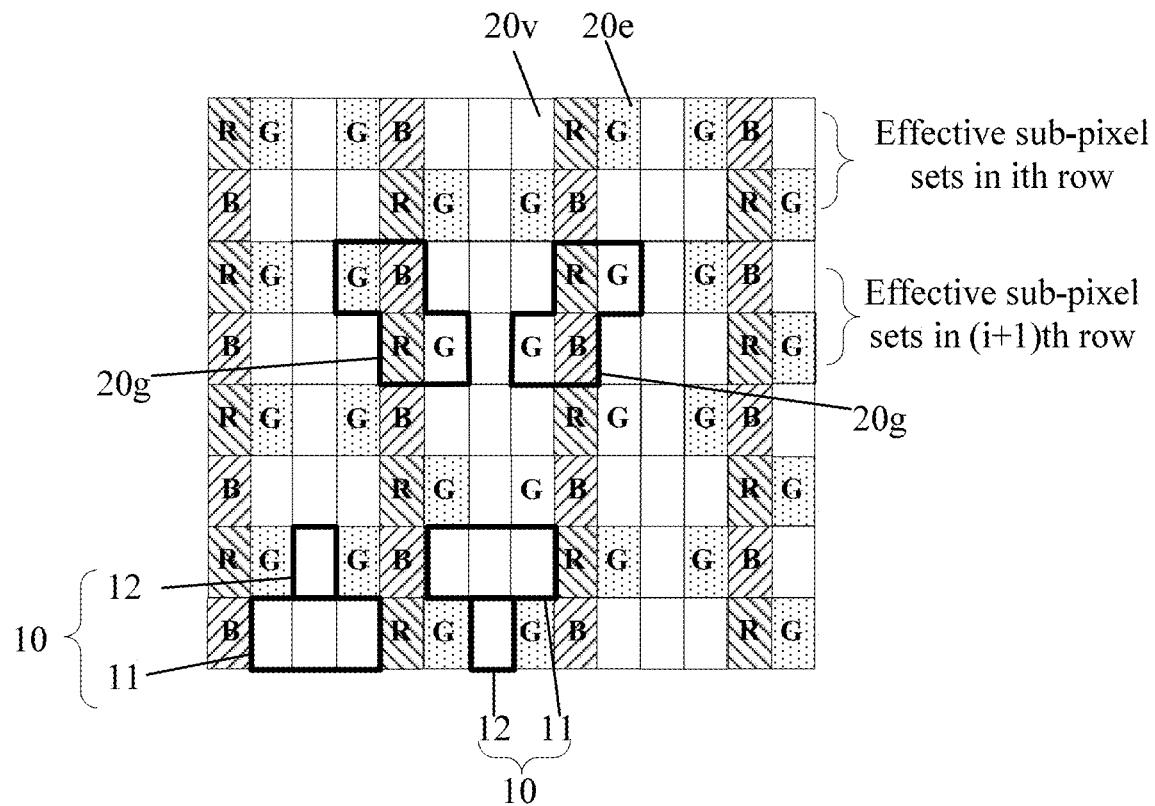
FIG. 7 is a schematic diagram showing a pixel arrangement in a light-transmitting region according to other embodiments of the present disclosure.

FIG. 7 is a schematic diagram showing a pixel arrangement in a light-transmitting region according to other embodiments of the present disclosure. In FIG. 7, like in the embodiment shown in FIG. 3, the light-transmitting region TA includes a plurality of effective sub-pixel sets 20g and a plurality of main spacers 10, and each effective sub-pixel set 20g includes a red sub-pixel R, a blue sub-pixel B, and two green sub-pixels G. Two adjacent effective sub-pixel sets 20g in the same row are spaced apart from each other by the main spacer 10. The main spacer 10 includes a first sub-spacer 11 and a second sub-spacer 12. Effective sub-pixels 20e are provided between at least two adjacent main spacers 10 arranged in the column direction; also, at least two main spacers 10 arranged in the column direction may be adjacent and connected to each other. At least one main spacer 10 is an axisymmetric pattern or a centrosymmetric pattern. In an example embodiment, each of the main spacers 10 is an axisymmetric pattern or a centrosymmetric pattern.

Unlike the arrangement shown in FIG. 3, in FIG. 7, the red sub-pixel R and the blue sub-pixel B of the effective sub-pixel set 20g are arranged in one column, two green sub-pixels G are respectively located at two sides of the column where the red sub-pixel R and the blue sub-pixel B are located, and the two green sub-pixels G are arranged in the same row as the red sub-pixel R and the blue sub-pixel B, respectively.

In FIG. 7, the first sub-spacer 11 and the second sub-spacer 12 are provided in the same row as the two rows of effective sub-pixels 20e. A width of the first sub-spacer 11 is 2 to 6 times a width of the second sub-spacer 12. For example, the second sub-spacer 12 of each main spacer 10 includes one vacant sub-pixel 20v, the first sub-spacer 11 includes three vacant sub-pixels 20v, and the width of the first sub-spacer 11 is three times the width 12 of the second sub-spacer.

Optionally, any two adjacent main spacers 10 arranged in the row direction are centrosymmetric, and any two adjacent effective sub-pixel sets 20g arranged in the row direction are mirror-symmetric in shape.

Figure 8:
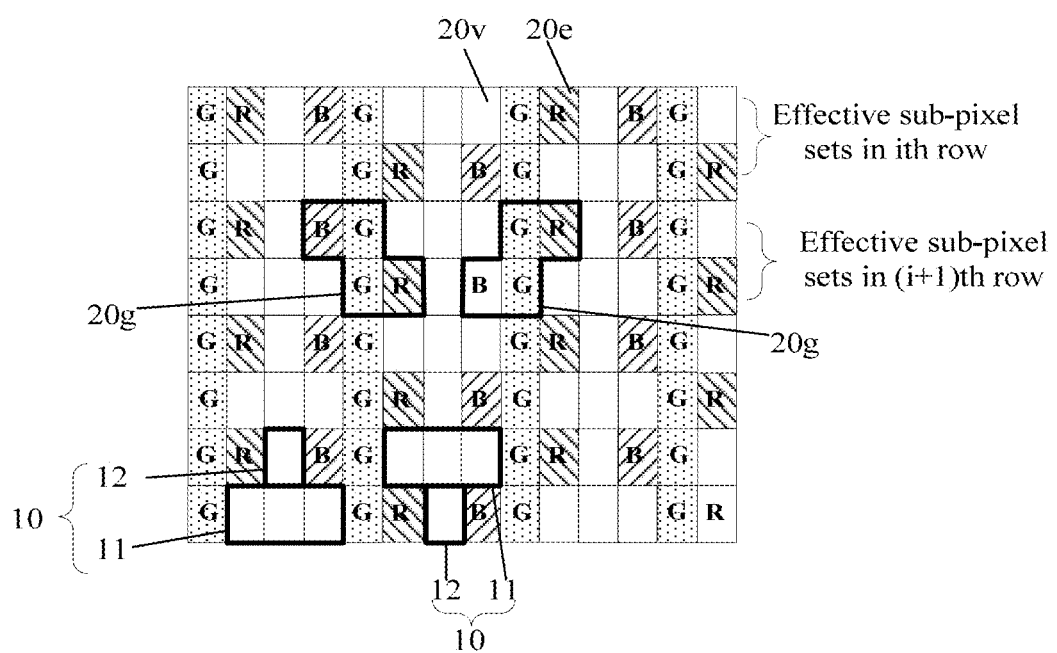
FIG. 8 is a schematic diagram showing a pixel arrangement in a light-transmitting region according to other embodiments of the present disclosure.

FIG. 8 is a schematic diagram showing a pixel arrangement in a light-transmitting region according to other embodiments of the present disclosure. The pixel arrangement shown in FIG. 8 is similar to that shown in FIG. 7, except that the positions of the red sub-pixel R, the green sub-pixels G, and the blue sub-pixel B in the effective sub-pixel set 20g in FIG. 8 are different from those in FIG. 7. As shown in FIG. 8, in the effective sub-pixel set 20g, two green sub-pixels G are located in the same column, the red sub-pixel R and the blue sub-pixel B are respectively located at two sides of the column where the two green sub-pixels G are located, the red sub-pixel R and one of the two green sub-pixels G are arranged along the same row direction, and the blue sub-pixel B and the other of the two green sub-pixels G are arranged along the same row direction.

Figure 9A:
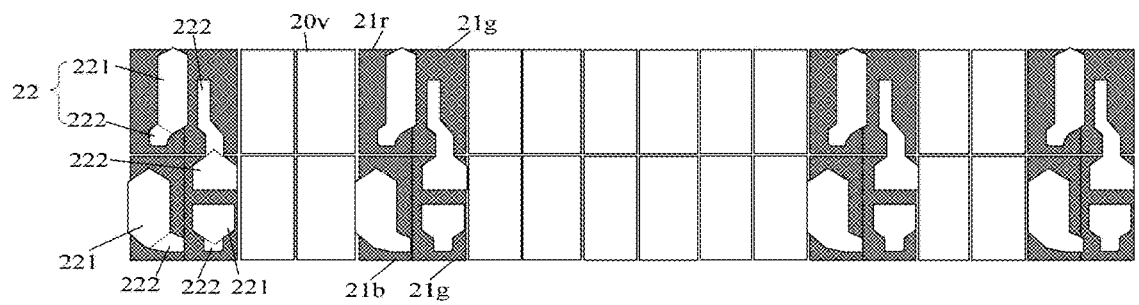
FIG. 9A is a schematic diagram showing an arrangement of pixel driving circuits and light-emitting units for effective sub-pixel sets in an $i^{th}$ row as shown in FIG. 3.
Figure 9B:
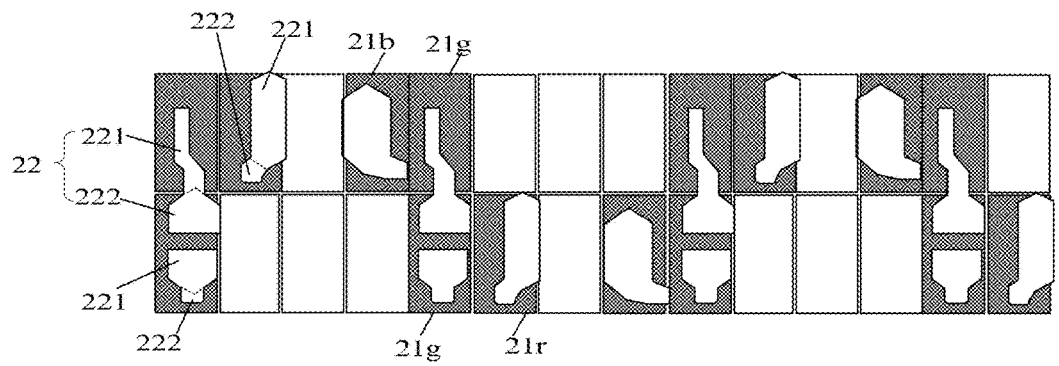
FIG. 9B is a schematic diagram showing an arrangement of pixel driving circuits and light-emitting units for effective sub-pixel sets in an $i^{th}$ row as shown in FIG. 8.

It should be noted that the pixel arrangement shown in the drawings of the present disclosure is only illustrative of the arrangement of the pixel driving circuits, and the arrangement of the light-emitting units connected to the pixel driving circuits may be different from the arrangement of the pixel driving circuits. FIG. 9A is a schematic diagram showing an arrangement of the pixel driving circuits and the light-emitting units in an $i^{th}$ row of effective sub-pixel set in FIG. 3, and FIG. 9B is a schematic diagram showing an arrangement of the pixel driving circuits and the light-emitting units in an $i^{th}$ row of effective sub-pixel set in FIG. 8. Here, the light-emitting unit includes the anode 22, the anode 22 includes a body portion 221 and a connection portion 222 connected to the pixel driving circuit 21, and a position of the body portion 221 of the anode 22 can be regarded as the position of the light-emitting unit. As shown in FIGS. 9A and 9B, the pixel driving circuits 21 in each effective sub-pixel 20e is connected to a plurality of signal lines (not shown), including a scan line, a data line, a first power line, a light emission control line, a reset line, etc. In each effective sub-pixel set 20g, the pixel driving circuit 21r of the red sub-pixel overlaps the body portion 221 of the anode 22 connected to the pixel driving circuit 21r along a thickness direction of the display substrate. The pixel driving circuit 21b of the blue sub-pixel overlaps the body portion 221 of the anode 22 connected to the pixel driving circuit 21b. For the two green sub-pixels arranged in the column direction, the body portion 221 of the anode 22 connected to the pixel driving circuit 21g in one of the two green sub-pixels overlaps the pixel driving circuit 21g in the other of the two green sub-pixels. It should be noted that the overlapping of the two structures means that the two structures overlap each other along the thickness direction of the display substrate.

Figure 10:
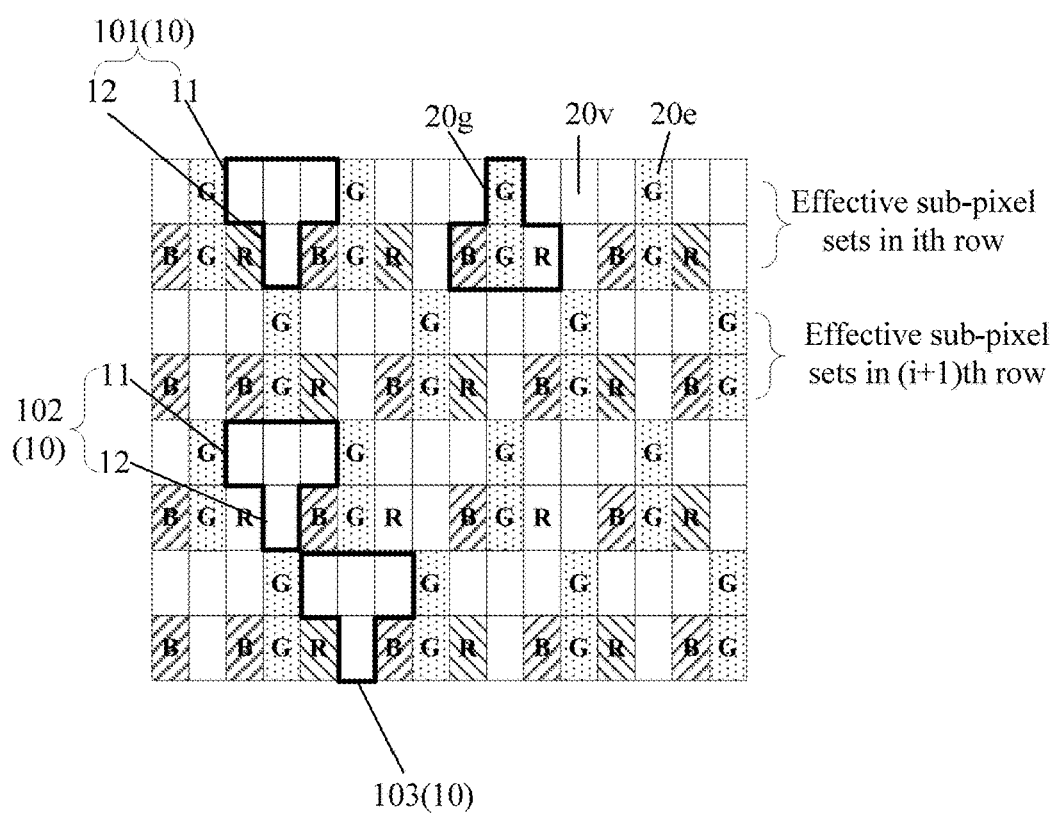
FIG. 10 is a schematic diagram showing a pixel arrangement in a light-transmitting region provided in other embodiments of the present disclosure.

FIG. 10 is a schematic diagram showing a pixel arrangement in a light-transmitting region according to other embodiments of the present disclosure. In FIG. 10, like the embodiment shown in FIG. 7, an effective sub-pixel set 20g includes one red sub-pixel R, one blue sub-pixel B, and two green sub-pixels G. The first sub-spacer 11 and the second sub-spacer 12 of the main spacer 10 are respectively disposed in the same row as two rows of the effective sub-pixels 20e, and the width of the first sub-spacer 11 is 2 to 6 times the width of the second sub-spacer 12. Effective sub-pixels 20e are disposed between at least two adjacent main spacers 10 (e.g., main spacers 101 and 102) arranged in the column direction.

Unlike the arrangement shown in FIG. 7, in FIG. 10, in two adjacent columns of main spacers 10, an orthographic projection of at least one main spacer 10 in one column of the two adjacent columns along the column direction overlaps an orthographic projection of at least one main spacer 10 in the other column of the two adjacent columns along the column direction, so as to improve the uniformity of display in the light-transmitting region. For example, in FIG. 10, an orthographic projection of the main spacer 101 along the column direction overlaps an orthographic projection of the main spacer 103 along the column direction, and an orthographic projection of the main spacer 102 along the column direction overlaps the orthographic projection of the main spacer 103 along the column direction. In addition, in FIG. 10, two green sub-pixels G in the effective sub-pixel set 20g are arranged in the column direction, and the red sub-pixel R and the blue sub-pixel B are respectively disposed on both sides of a same green sub-pixel G in the row direction. The red sub-pixel R in each effective sub-pixel set 20g is located at the same position, that is, the third position in the second row of each effective sub-pixel set 20g. Each of the green sub-pixels G in each effective sub-pixel set 20g is located at the same position, that is, the second position in the first row and the second position in the second row of each effective sub-pixel set 20g. The blue sub-pixel B in each effective sub-pixel set 20g is located at the same position, that is, the first position in the second row of each effective sub-pixel set 20g.

Further, In FIG. 10, two adjacent main spacers 10 arranged in the row direction are mirror-symmetric to each other.

In the arrangements shown in FIGS. 3, 7, 8 and 10, an area occupied by the main spacers 10 and an area occupied by the effective sub-pixel sets 20g are substantially the same, which is advantageous for improving the operation efficiency of driving the effective sub-pixels 20e by a driving system. In addition, in the arrangements shown in FIGS. 3, 7, 8 and 10, a ratio of the number of the effective sub-pixels 20e in different colors in the light-transmitting region TA is the same as that of the number of the effective sub-pixels 20e in different colors in the normal display region, so that the complexity of the rendering algorithm of the effective sub-pixels 20e in the light-transmitting region TA cannot be increased, and the display effect of the light-transmitting region TA is close to that of the normal display region.

Figure 11A:
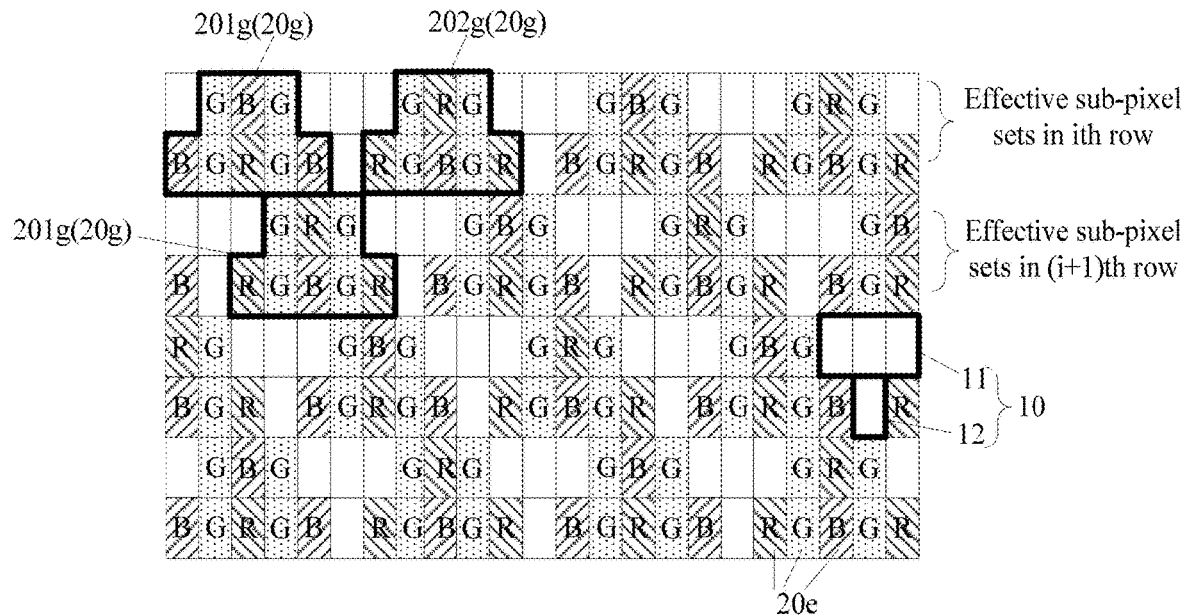
FIGS. 11A to 11C are schematic diagrams showing three pixel arrangements in a light-transmitting region according to other embodiments of the present disclosure.
Figure 11B:
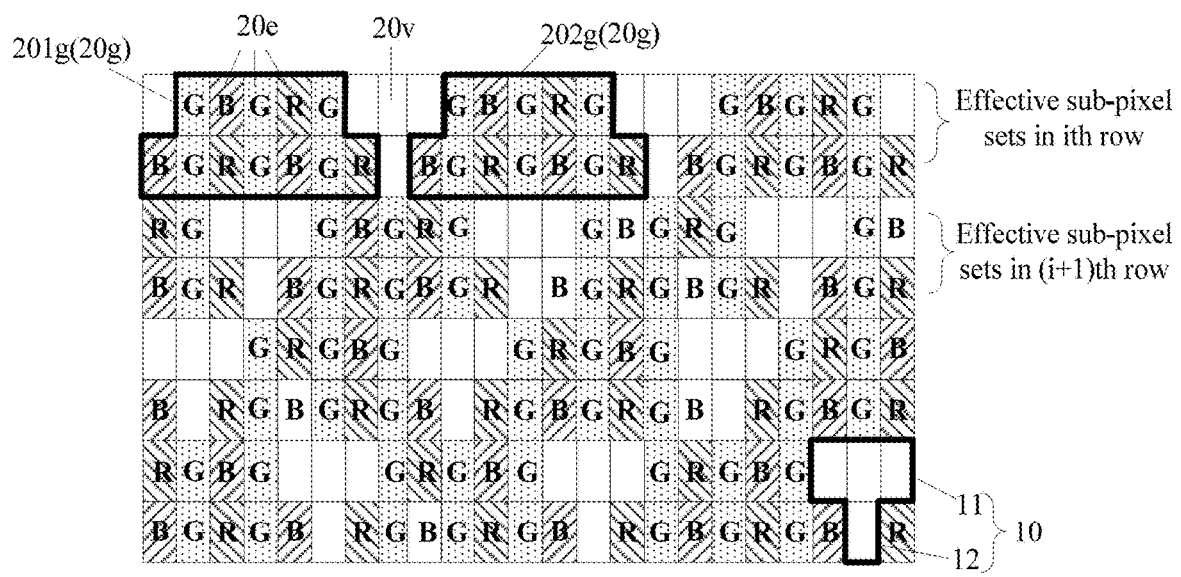
Figure 11C:
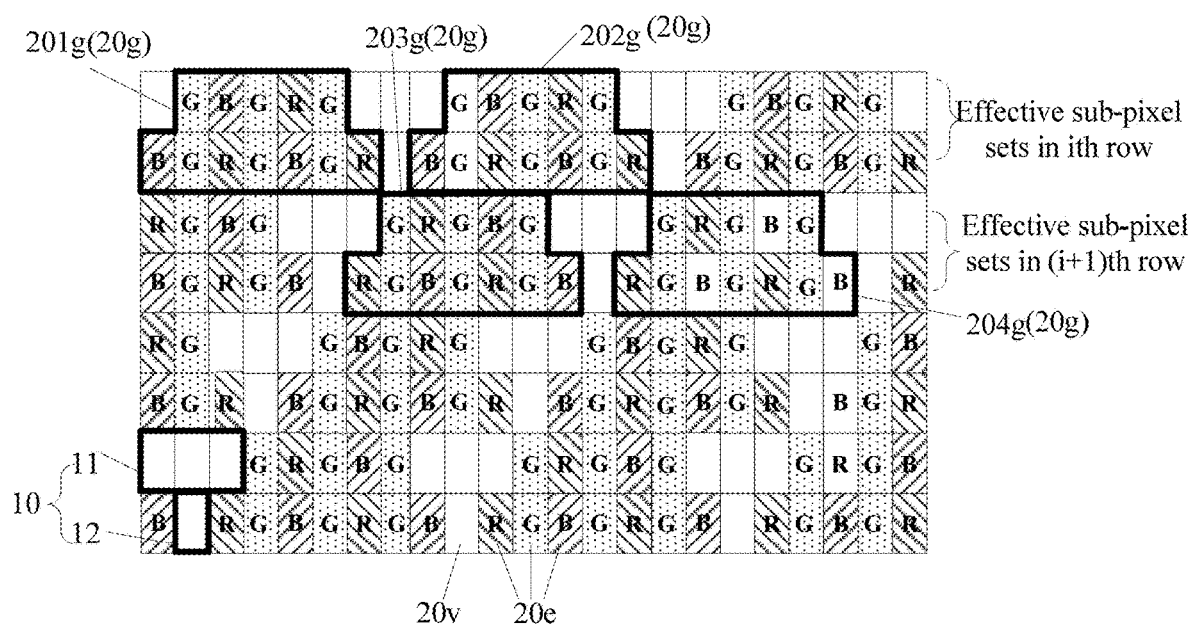

FIGS. 11A to 11C are schematic diagrams showing three pixel arrangements in a light-transmitting region according to other embodiments of the present disclosure. Like the embodiment shown in FIG. 10, in FIGS. 11A to 11C, effective sub-pixels 20e are disposed between at least two adjacent main spacers 10 arranged along the column direction. In two adjacent columns of main spacers 10, an orthographic projection of at least one main spacer 10 in one column of the two adjacent columns along the column direction overlaps an orthographic projection of at least one main spacer 10 in the other column of the two adjacent columns along the column direction. In addition, the effective sub-pixels 20e in the effective sub-pixel set 20g are arranged in two rows, and the first sub-spacer 11 and the second sub-spacer 12 of the main spacer 10 are respectively disposed in the same row as the two adjacent rows of effective sub-pixels 20e. The width of the first sub-spacer 11 is 2 to 4 times the width of the second sub-spacer 12. For example, the first sub-spacer 11 includes three vacant sub-pixels 20v, and the second sub-spacer 12 includes one vacant sub-pixel 20v. In addition, in FIGS. 11A to 11C, like the embodiment shown in FIG. 10, in the two adjacent effective sub-pixel sets 20g arranged in the row direction, a total number of green sub-pixels G: a total number of blue sub-pixels B: a total number of red sub-pixels R is=2:1:1.

As shown in FIGS. 11A to 11C, two adjacent effective sub-pixel sets 20g arranged in the row direction are mirror-symmetric in shape, and two adjacent main spacers 10 arranged in the row direction are mirror-symmetric in shape. The effective sub-pixel set 20g includes: red sub-pixels R, blue sub-pixels B and green sub-pixels G. Unlike FIG. 10, in FIGS. 11A to 11C, in the effective sub-pixel set 20g, the number of green sub-pixels G is an even number greater than or equal to 4, every two green sub-pixels G are arranged in one column, and one red sub-pixel R and one blue sub-pixel B are disposed between any two adjacent columns of green sub-pixels G. For example, as shown in FIG. 11A, the number of green sub-pixels G in each of effective sub-pixel sets 201g and 202g is four, and the four green sub-pixels G are arranged in two columns, each of which includes two green sub-pixels G. In two rows of effective sub-pixels 20e in the effective sub-pixel set 201g, the effective sub-pixels 20e in the first row include a green sub-pixel G, a blue sub-pixel B, and a green sub-pixel G sequentially arranged, and the effective sub-pixels 20e in the second row include a blue sub-pixel B, a green sub-pixel G, a red sub-pixel R, a green sub-pixel G, and a blue sub-pixel B. In two rows of sub-pixels 20e in the effective pixel set 202g, the effective sub-pixels 20e in the first row include a green sub-pixel G, a red sub-pixel R, and a green sub-pixel G, and the effective sub-pixels 20e in the second row include a red sub-pixels R, a green sub-pixels G, a blue sub-pixels B, a green sub-pixels G and a red sub-pixel R. In addition, unlike FIG. 10, in the arrangement of FIG. 11A, in two adjacent effective sub-pixel sets 20g arranged in the row direction, the positions of the green sub-pixels G are the same, and the positions of the red sub-pixels R in one of the two adjacent effective sub-pixel sets 20g are the same as the positions of the blue sub-pixels B in the other of the two adjacent effective sub-pixel sets 20g.

For example, as shown in FIGS. 11B and 11C, the number of green sub-pixels G in each of the effective sub-pixel sets 201g and 202g is six, and the six green sub-pixels G are arranged in three columns, each of which includes two green sub-pixels G. Unlike FIG. 11A, in the arrangement shown in FIG. 11B, the effective sub-pixels 20e in the same color are located at the same positions in the two adjacent effective sub-pixel sets 20g arranged in the row direction. As shown in FIGS. 11B and 11C, in two rows of effective sub-pixels 20e of the effective sub-pixel set 201g/202g, the effective sub-pixels 20e in the first row includes, a green sub-pixel G, a blue sub-pixel B, a green sub-pixel G, a red sub-pixel R and a green sub-pixel G arranged in sequence; effective sub-pixels 20e in the second row include a blue sub-pixel B, a green sub-pixel G, a red sub-pixel R, a green sub-pixel G, a blue sub-pixel B, a green sub-pixel G, a red sub-pixel R arranged in sequence. As shown in FIG. 11C, in two rows of effective sub-pixels 20e of the effective sub-pixel set 203g/204g, the effective sub-pixels 20e in the first row include a green sub-pixel G, a red sub-pixel R, a green sub-pixel G, a blue sub-pixel B and a green sub-pixel G arranged in sequence; the effective sub-pixels 20e in the second row include a red sub-pixel R, a green sub-pixel G, a blue sub-pixel B, a green sub-pixel G, a red sub-pixel R, a green sub-pixel G, a blue sub-pixel B arranged in sequence.

Compared with the arrangement of FIG. 10, the number of the effective sub-pixels 20e in each effective sub-pixel set 20g in FIGS. 11A to 11C is increased, and the area occupied by the main spacers 10 is not changed, so that the proportion of the area occupied by the main spacers 10 is decreased, thereby improving the display quality of the image.

Figure 12:
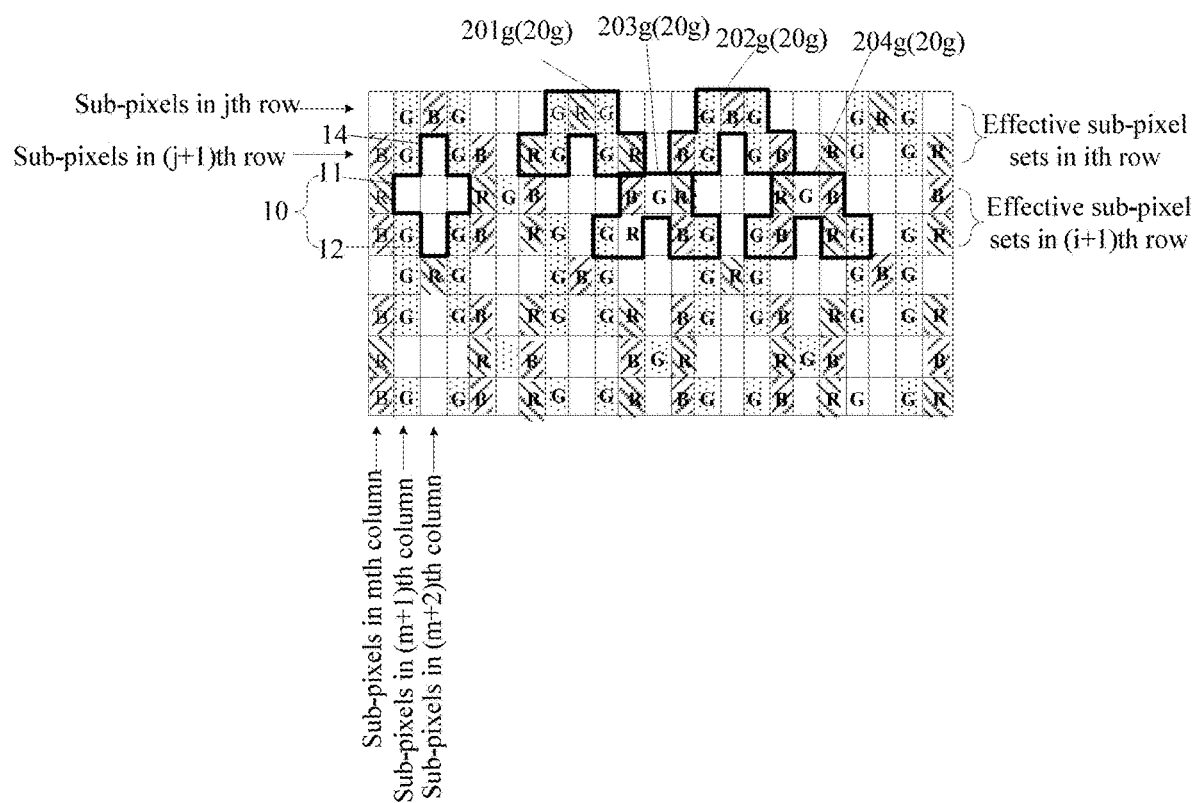
FIG. 12 is a schematic diagram showing a pixel arrangement in a light-transmitting region provided in other embodiments of the present disclosure.

FIG. 12 is a schematic diagram showing a pixel arrangement in a light-transmitting region provided in other embodiments of the present disclosure. The arrangement shown in FIG. 12 is similar to that in FIG. 11A, and only the difference between the arrangements of FIGS. 12 and 11A will be described below.

In FIG. 12, orthographic projections of two adjacent columns of main spacers 10 in the column direction may not overlap each other. In FIG. 12, first secondary-spacers 14 are further provided in the light-transmitting region TA, and each first secondary-spacer 14 is located between two effective sub-pixels 20e arranged in the row direction in the effective sub-pixel set 20e. The first secondary-spacer 14 may include one vacant sub-pixel 20v. In addition, in the at least one row of effective sub-pixel sets 20g, the effective sub-pixels 20e in the at least one effective sub-pixel set 20g include a plurality of green sub-pixels G, and a plurality of red sub-pixels R or a plurality of blue sub-pixels B. The number of the green sub-pixels G is an even number more than or equal to 4. Every two green sub-pixels G are arranged in one column, and both sides of each column of the green sub-pixels G are provided with blue sub-pixels B or red sub-pixels R. For example, in the $i^{th}$ row effective sub-pixel set 20g, the effective sub-pixel set 201g includes four green sub-pixels G and three red sub-pixels R, every two green sub-pixels G are arranged in one column, the red sub-pixels R are disposed on both sides of each column of the green sub-pixels G, and the first secondary-spacer 14 is disposed between the two green sub-pixels G arranged in the row direction. For another example, the effective sub-pixel set 202*g* includes four green sub-pixels G and three blue sub-pixels B, every two green sub-pixels G are arranged in one column, and the blue sub-pixels B are disposed on both sides of each column of green sub-pixels G. The first secondary-spacer 14 is provided between two green sub-pixels G arranged in the row direction. In the two adjacent effective sub-pixel sets 201*g* and 202*g*, a total number of the green sub-pixels G: a total number of the red sub-pixels R: a total number of the blue sub-pixels B is 8:3:3.

Optionally, in the effective sub-pixel sets 201*g* and 202*g*, the positions of the green sub-pixels G are the same, and the positions of the red sub-pixels R in the effective sub-pixel set 201*g* are the same as the positions of the blue sub-pixels B in the effective sub-pixel set 202*g*.

In at least one row (e.g., the (i+1)$^{th}$ row), at least one effective sub-pixel set 203*g*/204*g* includes a plurality of green sub-pixels B, a plurality of red sub-pixels R and a plurality of blue sub-pixels B. The plurality of red sub-pixels R and the plurality of blue sub-pixels B form a plurality of mixed-color sub-pixel columns arranged at intervals, each of which includes one red sub-pixel R and one blue sub-pixel B disposed in the same column, and green sub-pixels G are arranged on two sides of each of the mixed-color sub-pixel columns. The first secondary-spacer 14 is located between two mixed-color sub-pixel columns. In the two adjacent effective sub-pixel sets 203*g* and 204*g*, a total number of green sub-pixels G, a total number of red sub-pixels R and a total number of blue sub-pixels B is 4:3:3.

Optionally, in the effective sub-pixel sets 203*g* and 204*g*, the positions of the green sub-pixels G are the same, the positions of the red sub-pixels R in the effective sub-pixel set 203*g* are the same as the positions of the blue sub-pixels B in the effective sub-pixel set 204*g*, and the positions of the blue sub-pixels B in the effective sub-pixel set 203*g* are the same as the positions of the red sub-pixels R in the effective sub-pixel set 204*g*.

In the arrangement shown in FIG. 12, in the row direction, the proportion of the number of the vacant sub-pixels 20*v* in the j$^{th}$ row of sub-pixels is about 1:2; the proportion of the number of the vacant sub-pixels 20*v* in the (j+1)$^{th}$ row of sub-pixels is about 1:3, and so on. In the column direction, the proportion of the number of the vacant sub-pixels 20*v* in the m$^{th}$ column of sub-pixels is about 1:3, the proportion of the number of the vacant sub-pixels 20*v* in the (m+1)$^{th}$ column of sub-pixels is about 1:3, the proportion of the number of the vacant sub-pixels 20*v* in the (m+2)$^{th}$ column of sub-pixels is about 1:2, and so on. It can be seen that a difference between proportion of the number of the vacant sub-pixels 20*v* in the row direction and proportion of the number of the vacant sub-pixels 20*v* in the column direction is small, therefore the display uniformity of the entire light-transmitting region TA is good.

In addition, in FIG. 12, at least one main spacer 10 may be adjacent and connected to the first secondary-spacer 14, and the main spacer 10 and the first secondary-spacer 14 adjacent and connected to each other may form a centrosymmetric pattern and also an axisymmetric pattern.

Figure 13:
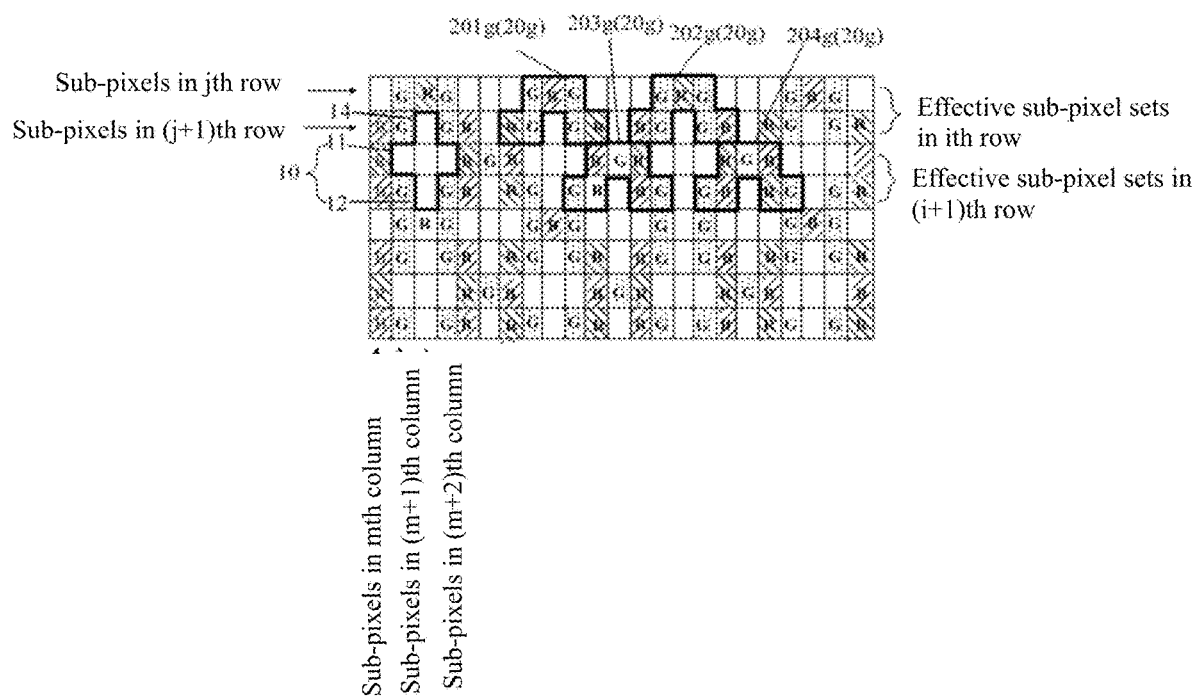
FIG. 13 is a schematic diagram showing a pixel arrangement in a light-transmitting region provided in other embodiments of the present disclosure.

FIG. 13 is a schematic diagram showing a pixel arrangement in a light-transmitting region according to other embodiments of the present disclosure. The arrangement shown in FIG. 13 is similar to that shown in FIG. 12, except that the colors of the effective sub-pixels 20*e* in some effective sub-pixel sets 20*g* are different from those in FIG. 12. As shown in FIG. 13, each effective sub-pixel set 20*g* includes red sub-pixels R, green sub-pixels G, and blue sub-pixels B. In the effective sub-pixel sets 20*g* in the i$^{th}$ row, the effective sub-pixel set 202*g* includes four green sub-pixels G, one red sub-pixel R, and two blue sub-pixels B. The effective sub-pixels 20*e* in the first row of the effective sub-pixel set 202*g* include a green sub-pixel G, a red sub-pixel R and a green sub-pixel G arranged in sequence; the effective sub-pixels 20*e* in the second row of the effective sub-pixel set 202*g* include a blue sub-pixel B, a green sub-pixel R, a green sub-pixel G, and a blue sub-pixel B arranged in sequence. The two green sub-pixels R are spaced apart from each other by the first secondary-spacer 14. The effective sub-pixel set 201*g* includes four green sub-pixels G, two red sub-pixels R, and one blue sub-pixel B. In the effective sub-pixel sets 202*g* and 201*g*, the green sub-pixels G are located at the same position; the red sub-pixels R in the effective sub-pixel set 201*g* are located at the same positions as the blue sub-pixels B in the effective sub-pixel set 202*g*; and the blue sub-pixels B in the effective sub-pixel set 201*g* are located at the same positions as the red sub-pixels R in the effective sub-pixel set 202*g*.

The arrangement of the effective sub-pixels 20*e* in the effective sub-pixel sets 20*g* in the (i+1)$^{th}$ row is the same as that of the effective sub-pixel sets 20*g* in the (i+1)$^{th}$ row in FIG. 12, and details are not repeated here.

Figure 14A:
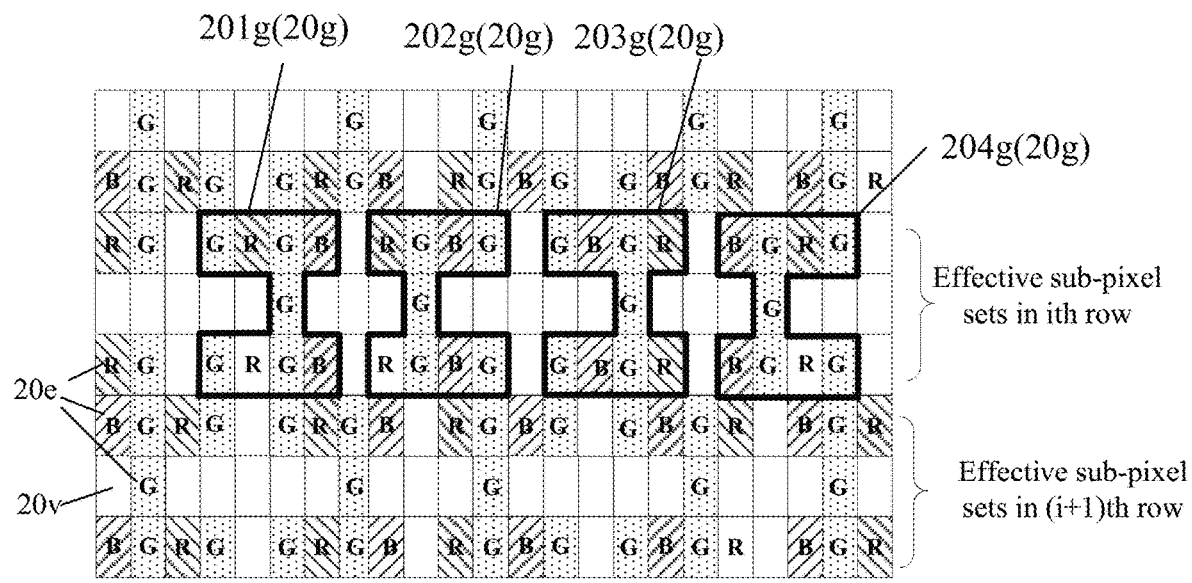
FIGS. 14A to 14C are schematic diagrams showing three pixel arrangements in a light-transmitting region according to other embodiments of the present disclosure.
Figure 14A:
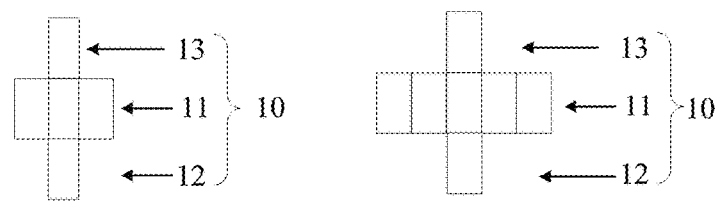
Figure 14B:
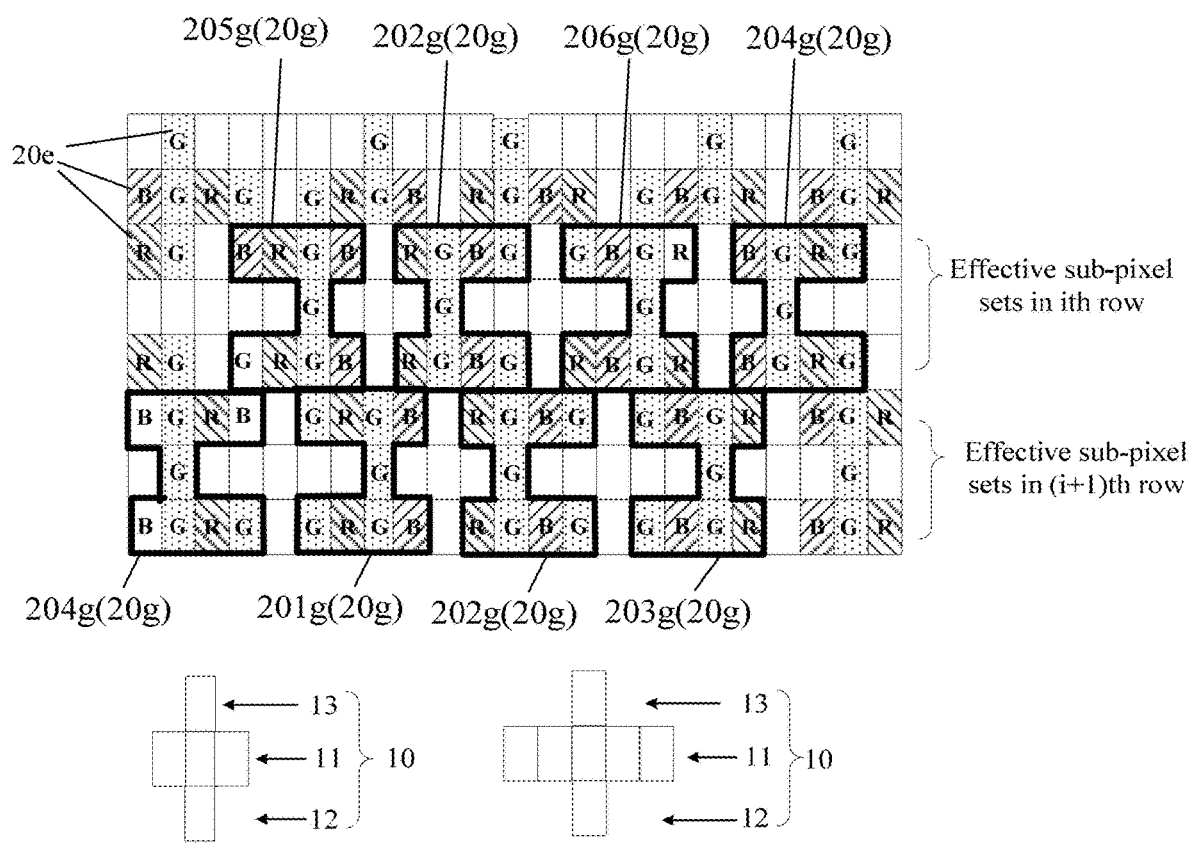
Figure 14C:
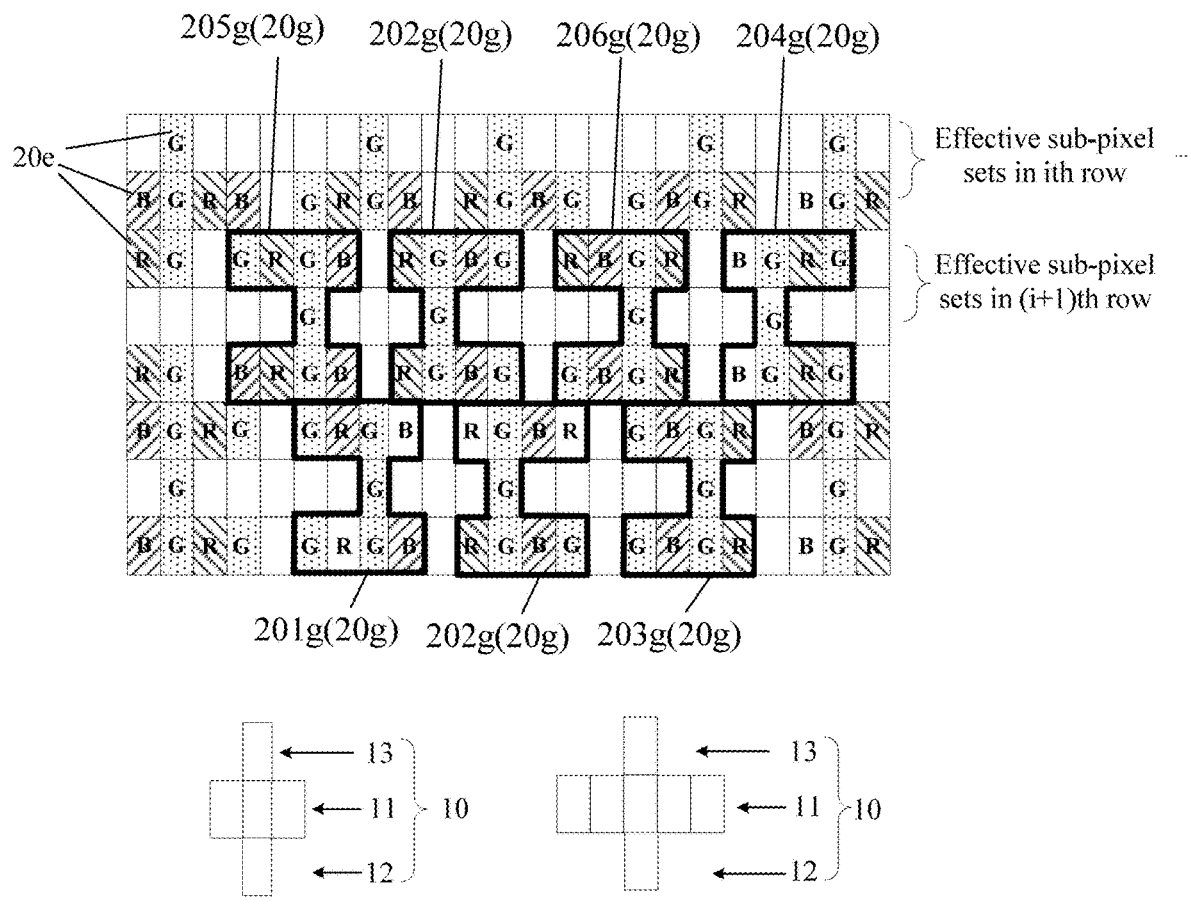

FIGS. 14A to 14C are schematic diagrams showing three pixel arrangements in a light-transmitting region according to other embodiments of the present disclosure, which are different from the arrangements in the foregoing embodiments in that in FIGS. 14A to 14C, orthographic projections of at least two main spacers 10 in the column direction have different widths. For example, among four consecutive main spacers 10, each of the orthographic projections of two main spacers 10 in the column direction has a width of 5 vacant sub-pixels 20*v*, and each of the orthographic projections of the other two main spacers 10 in the column direction has a width of 3 vacant sub-pixels 20*v*. In FIGS. 14A to 14C, the effective sub-pixels 20*e* in the effective sub-pixel set 20*g* are arranged in three rows, and a main spacer 10 between two adjacent effective sub-pixel sets 20*g* arranged in the row direction includes a third sub-spacer 13 in addition to the first sub-spacer 11 and the second sub-spacer 12. A width of the third sub-spacer 13 is smaller than the width of the first sub-spacer 11. For example, the third sub-spacer 13 and the second sub-spacer 12 have the same width which is the same as the width of each effective sub-pixel 20*e*. The first sub-spacer 11, the second sub-spacer 12, and the third sub-spacer 13 are respectively disposed in the same row as three rows of effective sub-pixels 20*e* arranged continuously.

For example, as shown in FIG. 14A, each of the effective sub-pixel sets 201*g* to 204*g* includes three rows of effective sub-pixels 20*e*, and each of the first row and the third row of effective sub-pixels 20*e* of the effective sub-pixel set 201*g* includes a green sub-pixel G, a red sub-pixel R, a green sub-pixel G and a blue sub-pixel B. The second row of the effective sub-pixels 20*e* of the effective sub-pixel set 201*g* includes one green sub-pixel G which is arranged in the same column as the green sub-pixel G between the red sub-pixel R and the blue sub-pixel B in the first row. Each of the first and third rows of effective sub-pixels 20*e* of the effective sub-pixel set 202*g* includes a red sub-pixel R, a green sub-pixel G, a blue sub-pixel B, and a green sub-pixel G arranged in sequence. The second row of the effective sub-pixels 20*e* of the effective sub-pixel set 202*g* includes one green sub-pixel R which is arranged in the same column as the green sub-pixel G between the red sub-pixel R and the blue sub-pixel B in the first row. Each of the first and third rows of effective sub-pixels 20e of the effective sub-pixel set 203g includes a green sub-pixel G, a blue sub-pixel B, a green sub-pixel G, and a red sub-pixel R arranged in sequence. The second row of effective sub-pixels 20e of the effective sub-pixel set 203g includes one green sub-pixel G which is arranged in the same column as the green sub-pixel G between the red sub-pixel R and the blue sub-pixel B in the first row. Each of the first and third rows of effective sub-pixels 20e of the effective sub-pixel set 204g includes a blue sub-pixel B, a green sub-pixel G, a red sub-pixel R and a green sub-pixel G. The second row of effective sub-pixels 20e of the effective sub-pixel set 204g includes one green sub-pixel G which is arranged in the same column as the green sub-pixel G between the red sub-pixel R and the blue sub-pixel B in the first row.

For example, as shown in FIGS. 14B and 14C, each of the effective sub-pixel sets 201g to 206g includes three rows of effective sub-pixels 20e. In the effective sub-pixel sets 20g in two adjacent rows (e.g., the effective sub-pixel sets 20g in the $i^{th}$ row and the $(i+1)^{th}$ row), the arrangement of the effective sub-pixels 20e of the effective sub-pixel sets 201g to 204g in the $(i+1)^{th}$ row, and the arrangement of the effective sub-pixels 20e of the effective sub-pixel sets 202g and 204g in the $i^{th}$ row may be referred to those in FIG. 14A. In the $i^{th}$ row of effective sub-pixel sets 20g, the effective sub-pixel set 205g has a similar arrangement to those of the effective sub-pixel set 201g in FIG. 14A, except that in FIGS. 14B and 14C, one of the effective sub-pixel 20e at the first positon and in the first row and the effective sub-pixel 20e at the first position and in the third row of the effective sub-pixel set 205g is a green sub-pixel G and the other one is a blue sub-pixel B; in the effective sub-pixel set 206g, one of the effective sub-pixel 20e at the first position and in the first row and the effective sub-pixel 20e at the first position and in the third row is a green sub-pixel G and the other one is a red sub-pixel R.

Optionally, as shown in FIGS. 14A to 14C, among the effective sub-pixel sets 201g to 206g, at least two adjacent effective sub-pixel sets 20g arranged in the row direction are mirror-symmetric in shape. At least two adjacent main spacers 10 arranged in the row direction are mirror-symmetric.

Optionally, as shown in FIGS. 14A to 14C, the width of the first sub-spacer 11 of the main spacer 10 is 2 to 6 times the width of the second sub-spacer 12, and the second sub-spacer 12 and the third sub-spacer 13 have the same width. For example, in at least one main spacer 10, the first sub-spacer 10 includes five vacant sub-pixels 20v, and each of the second sub-spacer 12 and the third sub-spacer 13 includes one vacant sub-pixel 20v; in the remaining at least one main spacer 10, the first sub-spacer 11 includes four vacant sub-pixels 20v, and each of the second and third sub-spacers 12 and 13 includes one vacant sub-pixel 20v.

Figure 15:
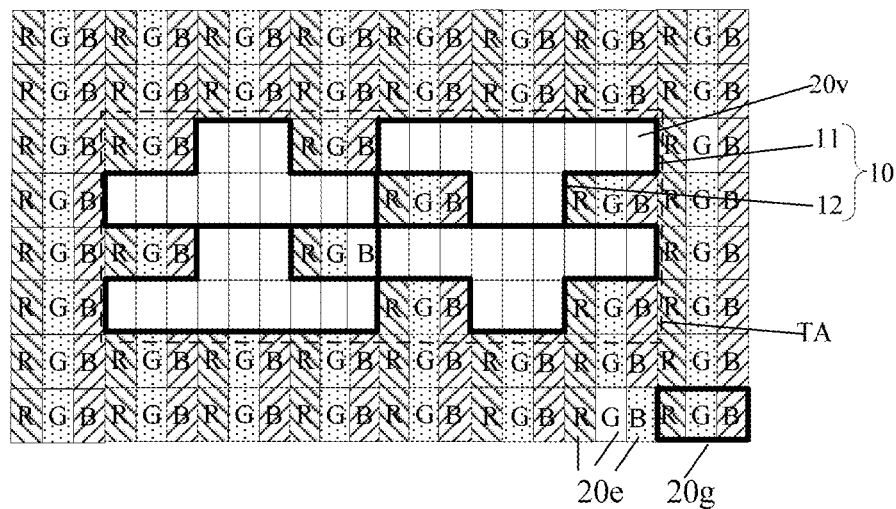
FIG. 15 is a schematic diagram showing a display substrate provided in other embodiments of the present disclosure.

FIG. 15 is a schematic diagram showing a display substrate provided in other embodiments of the present disclosure, which is different from the display substrate shown in FIG. 2 in that in the normal display region in FIG. 15, in each row of the effective sub-pixels 20e, the red sub-pixels R, the green sub-pixels G, and the blue sub-pixels B are arranged periodically. In the light-transmitting region TA, the effective sub-pixels 20e in each effective sub-pixel set 20g include a red sub-pixel R, a green sub-pixel G and a blue sub-pixel B. In the same effective sub-pixel set 20g, a ratio of the number of the red sub-pixels R, the number of the green sub-pixels G and the number of the blue sub-pixels B is 1:1:1. For example, the effective sub-pixel set 20g include one red sub-pixels R, one green sub-pixels G, and one blue sub-pixel B, or alternatively the effective sub-pixel set 20g include two red sub-pixels R, two green sub-pixels G, and two blue sub-pixel B. In the main spacer 10, both of the first sub-spacer 11 and the second sub-spacer 12 are respectively provided in the same row as the two rows of effective sub-pixel sets 20g.

Optionally, the width of the first sub-spacer 11 is 2 to 6 times the width of the second sub-spacer 12. For example, each effective sub-pixel set 20e includes one red sub-pixel R, one green sub-pixel G, and one blue sub-pixel B. The first sub-spacer 11 includes nine vacant sub-pixels 20v, and the second sub-spacer 12 includes three vacant sub-pixels 20v; or alternatively, the first sub-spacer 11 includes twelve vacant sub-pixels 20v, and the second sub-spacer 12 includes six vacant sub-pixels 20v. For another example, each of the effective sub-pixel sets 20e includes two red sub-pixels R, two green sub-pixels G, and two blue sub-pixels B, the first sub-spacer 11 includes fifteen vacant sub-pixels 20v, and the second sub-spacer includes three vacant sub-pixels 20v.

Figure 16A:
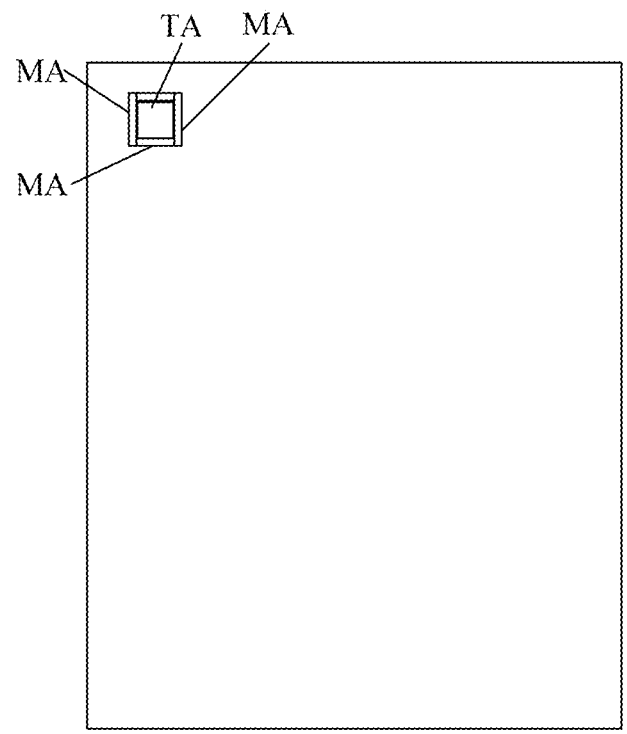
FIG. 16A is a schematic diagram showing an arrangement of regions of a display substrate provided in other embodiments of the present disclosure.
Figure 16B:
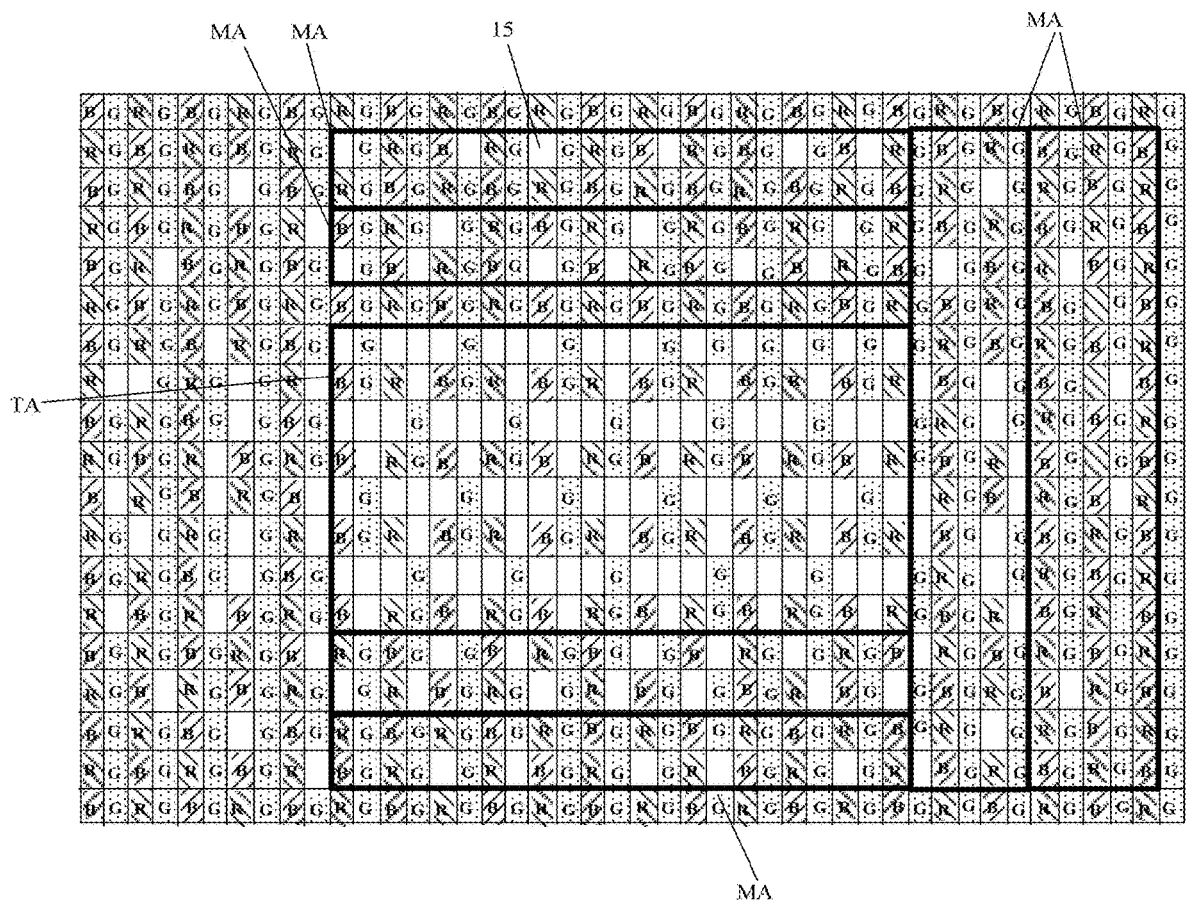
FIG. 16B is a schematic diagram showing a pixel arrangement for the display substrate shown in FIG. 16A.

FIG. 16A is a schematic diagram showing an arrangement of regions in a display substrate provided in other embodiments of the present disclosure, and FIG. 16B is a schematic diagram showing a pixel arrangement for the display substrate in FIG. 16A. As shown in FIGS. 16A and 16B, the display substrate includes a light-transmitting region TA and a normal display region AA. An arrangement of the effective sub-pixels 20e and the main spacers 10 in the light-transmitting region TA may adopt the arrangement in any one of the embodiments provided in the present disclosure. Unlike the display substrate in FIG. 2, a transition region MA is further provided on at least one side of the light-transmitting region TA in FIGS. 16A and 16B, and is located between the light-transmitting region TA and the normal display region AA. A proportion of an area occupied by the second secondary-spacers 15 in the transition region MA is smaller than a proportion of an area occupied by the plurality of main spacers 10 in the light-transmitting region TA. For example, in a unit area in the transition region MA, the area occupied by the second secondary-spacers 15 is x; and in a unit area in the normal display region AA, the area occupied by the main spacers 10 is y, x<y. The transition region MA may be configured so that there is a transition between the display effect of the normal display region AA to the display effect of the light-transmitting region TA. The transition region MA may be disposed on one side of the light-transmitting region TA, or alternatively may be disposed on at least two sides of the light-transmitting region TA.

Alternatively, a plurality of transition regions MA, arranged in a direction away from the light-transmitting region TA, are disposed on at least one side of the light-transmitting region TA. No effective sub-pixel 20e is provided between adjacent transition regions MA, or one or more rows of effective sub-pixels 20e may be provided between adjacent transition regions MA. The transition regions MA located on the same side of the light-transmitting region TA have the same area, and the farther the transition region is away from the light-transmitting region TA, the smaller the proportion of the area occupied by the second secondary-spacers 15 in the transition regions MA is; the closer the transition region is to the light-transmitting region TA, the larger the proportion of the area occupied by the second secondary-spacers 15 in the transition region MA is, which makes the transition of the display effect between the light-transmitting area TA and the normal display region smoother.

It should be noted that in the above embodiments, the display substrate includes the light-transmitting region TA, as an example. In other embodiments of the present disclosure, the entire region of the display substrate is provided as the light-transmitting region TA, so as to improve the light transmittance of the entire display substrate. It should be noted that the description of the pixel arrangement in the light-transmitting region TA in the above embodiments is only an exemplary description, and a new arrangement generated after the sub-pixels in the light-transmitting region A in the above embodiments are inverted, mirrored, rotated, or the like is also within the scope of the present disclosure.

Figure 17A:
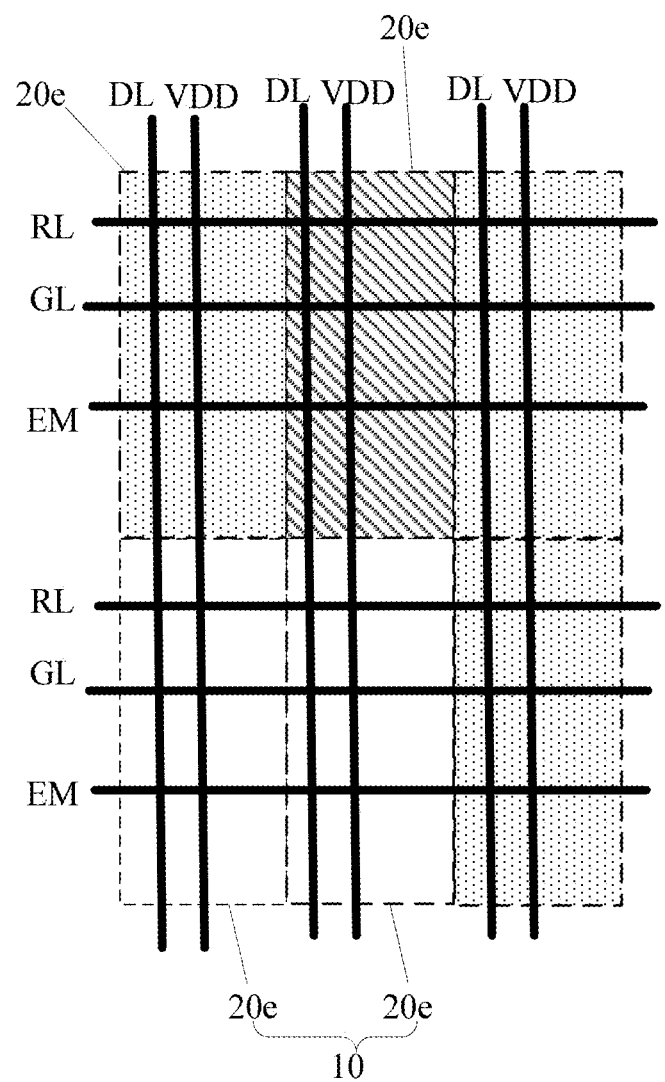
FIGS. 17A and 17B are schematic diagrams showing two arrangements of signal lines in a local region of a display substrate according to some embodiments of the present disclosure.
Figure 17B:
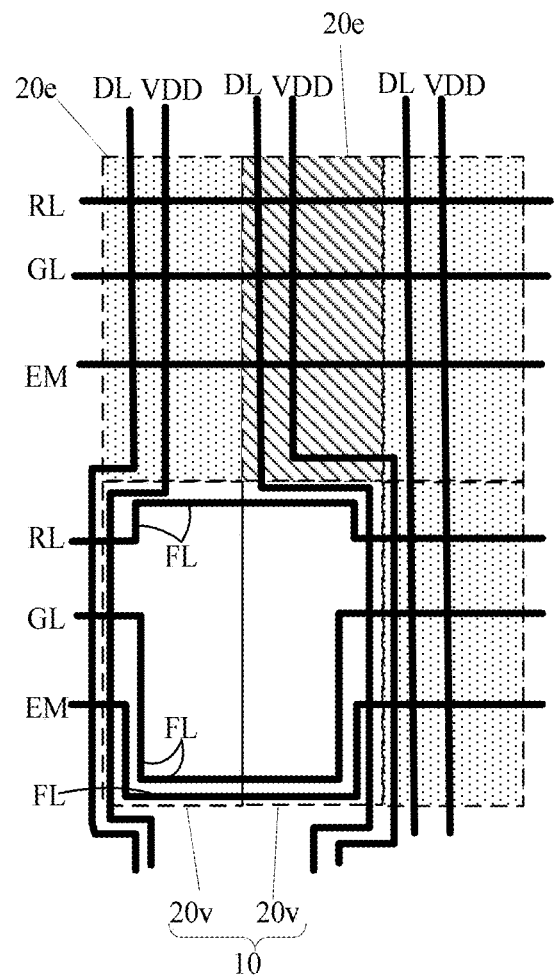

FIGS. 17A and 17B are schematic diagrams showing two arrangements of signal lines in a local region of a display substrate according to some embodiments of the present disclosure. As shown in FIG. 17A and FIG. 17B, a pixel driving circuit in an effective sub-pixel 20e is connected to a plurality of signal lines including a reset line RL, a scan line GL, a light emission control line EM, a first power line VDD, and a data line DL, wherein the reset line RL, the scan line GL, and the light emission control line EM extend in the row direction; the first power line VDD and the data line DL extend in the column direction. The plurality of pixel driving circuits arranged in the row direction are connected to the same reset line RL, the plurality of pixel driving circuits arranged in the row direction are connected to the same scan line GL, and the plurality of pixel driving circuits arranged in the row direction are connected to the same light emission control line EM; the plurality of pixel driving circuits arranged in the column direction are connected to the same data line DL, and the plurality of pixel driving circuits arranged in the column direction are connected to the same first power line VDD.

In some embodiments, as shown in FIG. 17A, each of the signal lines is a straight line.

However, when the signal lines are made of metal, if the signal lines directly pass through the main spacer, a certain diffraction effect of the light may be generated on the main spacer. For this reason, in another embodiment, as shown in FIG. 17B, at least one signal line includes a bent portion FL that is bent along an edge of the main spacer 10, so that a continuous light-transmitting region having an area as large as possible is formed at the position of the main spacer 10 to improve the diffraction of the light generated on the main spacer 10 as much as possible. In some examples, the bent portion FL is bent along the edge of the main spacer 10 and overlaps the main spacer 10; in other embodiments, the bent portion FL may bypass the entire main spacer 10.

An embodiment of the present disclosure further provides a display device, which includes the display substrate in the above embodiments. The display device may be a mobile phone, a tablet computer, a notebook computer, a television, a transparent show window glass and other products with display functions.

It should be understood that the above embodiments are merely exemplary embodiments adopted to explain the principles of the present disclosure, and the present disclosure is not limited thereto. It will be apparent to one of ordinary skill in the art that various changes and modifications may be made therein without departing from the spirit and scope of the present disclosure, and such changes and modifications also fall within the scope of the present disclosure.

What is claimed is:

1. A display substrate, comprising a light-transmitting region and a normal display region surrounding the light-transmitting region,
wherein the light-transmitting region comprises a plurality of rows of effective sub-pixel sets and a plurality of main light-transmitting regions, each row of the plurality of rows of effective sub-pixel sets comprises a plurality of effective sub-pixel sets, each of the plurality of effective sub-pixel sets comprises a plurality of effective sub-pixels, any two adjacent effective sub-pixel sets in a same row are spaced apart from each other by one main light-transmitting region, the main light-transmitting region comprises at least two sub-light-transmitting regions arranged along a column direction, and
wherein at least two sub-light-transmitting regions arranged along a row direction have different widths; and/or at least two sub-light-transmitting regions of a same main sub-light-transmitting region have different widths,
in the light-transmitting region, each effective sub-pixel comprises a pixel driving circuit for driving the effective sub-pixel to emit light; in the light-transmitting region, at least one of the plurality of signal lines connected to the effective sub-pixel comprises a portion extending along a row direction or a column direction in a region where the effective sub-pixel is located and a bent portion bending along an edge of the main light-transmitting region adjacent to the effective sub-pixel.

2. The display substrate of claim 1, wherein
the at least two sub-light-transmitting regions comprise a first sub-light-transmitting region and a second sub-light-transmitting region, and
a width of the first sub-light-transmitting region is 2 to 6 times a width of the second sub-light-transmitting region.

3. The display substrate of claim 1, wherein multiple effective sub-pixels are between at least two adjacent main light-transmitting regions arranged in the column direction.

4. The display substrate of claim 3, wherein the at least two main light-transmitting regions arranged in the column direction are adjacent and connected to each other.

5. The display substrate of claim 1, wherein an orthographic projection of at least one main light-transmitting region in one column of two adjacent columns of main light-transmitting regions along the column direction overlaps an orthographic projection of at least one main light-transmitting region in the other column of the two adjacent columns of main light-transmitting regions along the column direction.

6. The display substrate of claim 1, wherein orthographic projections of at least two columns of main light-transmitting regions along the column direction have different widths, or
at least one of the main light-transmitting regions is an axisymmetric pattern or a centrosymmetric pattern.

7. The display substrate of claim 1, wherein any two adjacent sub-light-transmitting regions arranged in the row direction have different widths; and/or any two adjacent sub-light-transmitting regions of a same main sub-light-transmitting region have different widths.

8. The display substrate of claim 2, wherein the plurality of effective sub-pixels in each of the plurality effective sub-pixel sets are arranged in two rows, and the first sub-light-transmitting region and the second sub-light-transmitting region are respectively in the same row as two adjacent rows of effective sub-pixel sets.

9. The display substrate of claim 8, wherein
the plurality of effective sub-pixels in each of the plurality effective sub-pixel sets are arranged in two rows and two columns, and
the plurality of effective sub-pixels in each of the plurality effective sub-pixel sets comprise a red sub-pixel, a blue sub-pixel and two green sub-pixels, wherein the two green sub-pixels are in a same column.

10. The display substrate of claim 1, wherein
the plurality of effective sub-pixels in each of the plurality effective sub-pixel sets are arranged in two rows,
the at least two sub-light-transmitting regions comprise a first sub-light-transmitting region and a second sub-light-transmitting region, and
the first sub-light-transmitting region and the second sub-light-transmitting region are respectively in the same row as two adjacent rows of effective sub-pixels.

11. The display substrate of claim 10, wherein the plurality of effective sub-pixels in each of the plurality effective sub-pixel sets comprise: one first color sub-pixel, two second color sub-pixels and one third color sub-pixel, wherein the two second color sub-pixels are in a same column, and the first color sub-pixel and the third color sub-pixel are respectively on two sides of the column in which the two second color sub-pixels are positioned; and
the first color sub-pixel, the third color sub-pixel and one of the two second color sub-pixels are arranged along the row direction; or
the first color sub-pixel and one of the two second color sub-pixels are arranged along the row direction, and the third color sub-pixel and the other of the two second color sub-pixels are arranged along the row direction.

12. The display substrate of claim 10, wherein the plurality of effective sub-pixels in each of the plurality of the effective sub-pixel sets comprise a first color sub-pixel, a second color sub-pixel and a third color sub-pixel,
in each of the plurality of the effective sub-pixel sets, a number of the second color sub-pixels is an even number more than or equal to 4, every two second color sub-pixels are arranged in a column, the first color sub-pixel and the third color sub-pixel are arranged between two adjacent columns of the second color sub-pixels,
in at least two adjacent effective sub-pixel sets arranged along the row direction, a proportion of a total number of the second color sub-pixel, a total number of the first color sub-pixel, and a total number of the third color sub-pixel is 2:1:1.

13. The display substrate of claim 10, further comprising a plurality of first secondary light-transmitting regions in the light-transmitting region, each of which is between two adjacent effective sub-pixels arranged in the row direction of each of the effective sub-pixel sets.

14. The display substrate of claim 13, wherein a plurality of effective sub-pixels of at least one of the effective sub-pixel sets comprises: second color sub-pixels and first color sub-pixels or third color sub-pixels, a number of the second color sub-pixels is an even number greater than or equal to 4, every two second color sub-pixels are arranged in a column, the first color sub-pixels or the third color sub-pixels are arranged on two sides of each column of the second color sub-pixels, and the first secondary light-transmitting region is between every two adjacent columns of the second color sub-pixels;
at least one of the remaining effective sub-pixel sets comprises second color sub-pixels, first color sub-pixels, and third color sub-pixels, the first color sub-pixels and the third color sub-pixels form mixed-color sub-pixel columns spaced apart from each other, each of the mixed-color sub-pixel columns comprises one first color sub-pixel and one third color sub-pixel, the second color sub-pixels are arranged on two sides of each of the mixed-color sub-pixel columns, and the first secondary light-transmitting region is between every two adjacent mixed-color sub-pixel columns.

15. The display substrate of claim 1, wherein the plurality of effective sub-pixels in each of the effective sub-pixel sets comprise a first color sub-pixel, a second color sub-pixel and a third color sub-pixel,
in at least two adjacent effective sub-pixel sets arranged along the row direction, the first color sub-pixels have the same position, the second color sub-pixels have the same position, and the third color sub-pixels have the same position; or
in two adjacent effective sub-pixel sets arranged along the row direction, the second color sub-pixels have the same position, and the first color sub-pixel of one of the at least two adjacent effective sub-pixel sets has the same position as the third color sub-pixel of the other of the at least two adjacent effective sub-pixel sets.

16. The display substrate of claim 2, wherein
the plurality of effective sub-pixels in each of the effective sub-pixel sets are arranged in three rows,
the main light-transmitting region further comprises a third sub-light-transmitting region having a width smaller than a width of the first sub-light-transmitting region, and
the first sub-light-transmitting region, the second sub-light-transmitting region and the third sub-light-transmitting region are respectively arranged in the same row as three rows of the effective sub-pixels continuously arranged.

17. The display substrate of claim 16, wherein the plurality of effective sub-pixels in each of the effective sub-pixel sets comprise: second color sub-pixels and first color sub-pixels or third color sub-pixels,
in four effective sub-pixel sets arranged continuously in the row direction, a proportion of a total number of the second color sub-pixels, a total number of the third color sub-pixels, and a total number of the first color sub-pixels is 2:1:1 or 5:2:2.

18. The display substrate of claim 1, wherein the display substrate further comprises: a normal display region around the light-transmitting region and a transition region on at least one side of the light-transmitting region, the transition region is between the light-transmitting region and the normal display region, the transition region comprises: a plurality of effective sub-pixels and a plurality of second secondary light-transmitting regions, a proportion of an area occupied by the plurality of second secondary light-transmitting regions in the transition region is smaller than a proportion of an area occupied by the plurality of main light-transmitting regions in the light-transmitting region.

19. A display device, comprising the display substrate of claim 1.

20. The display substrate of claim 1, wherein an orthographic projection of the bent portion of the signal line on a base substrate is within an orthographic projection, on the base substrate, of the main light-transmitting region adjacent to the effective sub-pixel in the light-transmitting region.

* * * * *